(12) United States Patent
Kondo et al.

(10) Patent No.: US 7,648,774 B2
(45) Date of Patent: *Jan. 19, 2010

(54) FERRITE THIN FILM, METHOD OF MANUFACTURING THE SAME AND ELECTROMAGNETIC NOISE SUPPRESSOR USING THE SAME

(75) Inventors: Koichi Kondo, Sendai (JP); Okikuni Takahata, Sendai (JP); Tatsuya Chiba, Sendai (JP); Hiroshi Ono, Sendai (JP); Shigeyoshi Yoshida, Sendai (JP); Masanori Abe, Tokyo (JP); Masahiro Yamaguchi, Sendai (JP)

(73) Assignee: NEC Tokin Corporation, Miyagi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/283,889

(22) Filed: Sep. 16, 2008

(65) Prior Publication Data

US 2009/0061256 A1 Mar. 5, 2009

Related U.S. Application Data

(62) Division of application No. 11/634,402, filed on Dec. 6, 2006, now Pat. No. 7,438,946, which is a division of application No. 10/660,071, filed on Sep. 11, 2003, now Pat. No. 7,160,636.

(30) Foreign Application Priority Data

| Sep. 13, 2002 | (JP) | ............................. 2002-268687 |
| Sep. 13, 2002 | (JP) | ............................. 2002-268932 |
| Sep. 13, 2002 | (JP) | ............................. 2002-269009 |

(51) Int. Cl.
*G11B 5/64* (2006.01)
*B32B 15/00* (2006.01)
*B05D 5/12* (2006.01)

(52) U.S. Cl. .................... 428/611; 428/693.1; 427/127; 257/659

(58) Field of Classification Search ................. 428/611, 428/328, 329, 402, 694.1, 694.2, 492, 493, 428/900, 553, 545, 836.1, 692.1, 693.2; 427/127; 257/659; 148/301, 305

See application file for complete search history.

(56) References Cited

U.S. PATENT DOCUMENTS 5,094,897 A 3/1992 Morita et al.

(Continued)

FOREIGN PATENT DOCUMENTS

JP 59-111929 A 6/1984

(Continued)

OTHER PUBLICATIONS

Kondo, et al., "Conducted noise suppression effect up to 3 GHz by NiZn ferrite film plated at 90° C directly onto printed circuit board," *Journal of Applied Physics*, May 15, 2003, vol. 93, No. 10, American Institute of Physics, pp. 7130-7132 (Presented Nov. 13, 2002).

(Continued)

*Primary Examiner*—Kevin M. Bernatz
*Assistant Examiner*—Louis Falasco
(74) *Attorney, Agent, or Firm*—Frishauf, Holtz, Goodman & Chick, P.C.

(57) ABSTRACT

An electromagnetic noise suppressor including a ferrite film is formed by regularly arranging constituents such as magnetized grains or one analogous to that. In the ferrite film, the constituents have at least one of the uniaxial anisotropy and the multiaxial anisotropy. The ferrite film has the magnetic anisotropy or the magnetic isotropy. The ferrite film is formed by a plating method in the presence of a magnetic field.

24 Claims, 9 Drawing Sheets

U.S. PATENT DOCUMENTS

| | | | |
|---|---|---|---|
| 5,094,898 A | | 3/1992 | Morita et al. |
| 5,278,704 A | | 1/1994 | Matsuda et al. |
| 5,336,337 A | * | 8/1994 | Funayama et al. .......... 148/301 |
| 5,453,328 A | * | 9/1995 | Nagano et al. .............. 428/545 |
| 5,833,770 A | * | 11/1998 | Ominato et al. ............ 148/305 |
| 6,136,431 A | | 10/2000 | Inoue et al. |
| 6,139,766 A | | 10/2000 | Taguchi et al. |
| 6,159,594 A | | 12/2000 | Tamari et al. |
| 6,544,672 B1 | | 4/2003 | Futamoto et al. |
| 7,160,636 B2 | * | 1/2007 | Kondo et al. ............. 428/836.1 |
| 2002/0030249 A1 | * | 3/2002 | Yoshida et al. .............. 257/659 |
| 2003/0003324 A1 | | 1/2003 | Fleming et al. |
| 2003/0235709 A1 | * | 12/2003 | Herron ....................... 428/553 |
| 2004/0238796 A1 | | 12/2004 | Abe |

FOREIGN PATENT DOCUMENTS

| | | |
|---|---|---|
| JP | 60-140713 A | 7/1985 |
| JP | 60140713 | 7/1985 |
| JP | 60-202522 A | 10/1985 |
| JP | 61-30674 A | 2/1986 |
| JP | 61-179877 A | 8/1986 |
| JP | 61-222924 A | 10/1986 |
| JP | 62-204505 A | 9/1987 |
| JP | 63-42378 A | 2/1988 |
| JP | 63-181305 A | 7/1988 |
| JP | 1-246149 A | 10/1989 |
| JP | 2-116624 A | 5/1990 |
| JP | 2-116631 A | 5/1990 |
| JP | 2248328 | 10/1990 |
| JP | 3-38006 A | 2/1991 |
| JP | 3038006 | 2/1991 |
| JP | 9-162588 A | 6/1997 |
| JP | 9-252191 A | 9/1997 |
| JP | 10303024 | 11/1998 |
| JP | 2001053486 | 2/2001 |
| WO | WO 03/015109 A1 | 2/2003 |

OTHER PUBLICATIONS

Kondo, et al., "Cole-Cole Impendance Analysis on Spin Sprayed Ni—Zn—Co Ferrite Films Exhibiting Strong Magnetic Loss in Gigahertz Range," *IEEE Transactions on Magnetics*, Sep. 2003, vol. 39, No. 5, pp. 3130-3132 (Presented at Meeting Mar. 30-Apr. 3, 2003).

Kondo, et al., "Noise absorption effect of a ferrite thin film plated directly on the printed circuit board," (2002), *26th Meeting of Magnetics Society of Japan*, 20aE-8, p. 471, published Sep. 17, 2002 (Presented Sep. 20, 2002) (English language Abstract).

Kondo et al., "Conducted noise suppression in the GHz range by ferrite thin films plated onto polyimide sheets," published May 21, 2003, 2-51A, p. 206, (2003) (Presented May 23, 2003 at the meeting of Japan Society of Powder and Powder Metallurgy) (English language Abstract).

Matsushita et al. (IEEE Transcripts on Magnetics, vol. 38, No. 5 (Sep. 2002) Ni—Zn—Co Ferrite Films).

* cited by examiner

FERRITE THIN FILM, METHOD OF MANUFACTURING THE SAME AND ELECTROMAGNETIC NOISE SUPPRESSOR USING THE SAME

This is a divisional of Ser. No. 11/634,402, filed Dec. 6, 2006, now U.S. Pat. No. 7,438,946 (allowed) which is a Divisional Application of application Ser. No. 10/660,071 filed Sep. 11, 2003, now U.S. Pat. No. 7,160,636.

The present application claims priority to prior Japanese patent applications JP 2002-268932, JP 2002-26867 and JP 2002-269009, the disclosures of which are incorporated herein by reference.

BACKGROUND OF THE INVENTION

The present invention relates to a spinel type ferrite film high in the utility value in particular in high frequency magnetic devices such as, inductance elements, impedance elements, magnetic heads, microwave elements, magnetostrictive elements and electromagnetic interference suppressors that are used to suppress electromagnetic interference owing to the unnecessary electromagnetic waves in a high frequency region and a manufacturing method thereof.

In a ferrite plating process, as mentioned in Japanese Unexamined Patent Publication No. S59-111929 (hereinafter referred to as "literature 1"), an aqueous solution containing at least ferrous ion as a metal ion is brought into contact with a solid surface, thereby $Fe^{2+}$ alone or both of $Fe^{2+}$ and another metal ion are allowed to be absorbed on the solid surface, subsequently the absorbed $Fe^{2+}$ is oxidized and thereby $Fe^{3+}$ is obtained, this causes a ferrite crystallization reaction with the metal ion in the aqueous solution, and thereby a ferrite film is formed on the solid surface.

So far, there are various processes that are proposed based on the above process: one that intends to homogenize a ferrite film and improve a reaction rate (for instance, Japanese Unexamined Patent Publication No. S60-140713 (hereinafter referred to as "literature 2")), another one that intends to form a ferrite film on various solids by endowing a solid surface with the surface activity (for instance, JP-A No. 61-030674 (hereinafter referred to as "literature 3")), and still another one that intends to improve the formation rate of a ferrite film (for instance, Japanese Unexamined Patent Publications Nos. S61-179877 and S63-42378, and JP-A No. 02-116631 (hereinafter referred to, respectively, as "literature 4", "literature 5" and "literature 6")).

In the ferrite plating, as far as a solid on which a ferrite film is intended to form is resistant against the aqueous solution, any solid can be used. Furthermore, since it is a reaction through an aqueous solution, an advantage is made in that a spinel type ferrite film can be formed at a relatively low temperature between room temperature and a boiling point or less of the aqueous solution. Accordingly, in comparison with other processes of forming a ferrite film, a limiting range on the solid is smaller.

In order to improve the characteristics of such ferrite films, various trials have been attempted.

For instance, Japanese Unexamined Patent Publication No. H02-116624 (hereinafter referred to as "literature 7") discloses a method in which with paying attention to an improvement in the magnetic characteristics of a ferrite film, the ferrite plating is carried out in a magnetic field, and thereby the soft magnetic characteristics are improved.

Furthermore, JP-A No. 3-38006 (hereinafter referred to as "literature 8") proposes a method in which a solution containing at least ferrous ion is brought into contact with a substrate in a magnetic field, the ferrite plating is applied on a solid surface in a magnetic field, and thereby a ferrite film having the uniaxial anisotropy is obtained; and a method in which an oxidant is contained in a solution to oxidize ferrous ion.

Still furthermore, JP-A No. 60-202522 (hereinafter referred to as "literature 9") discloses that when attentions are paid to a composition of ferrite and a weight ratio of Co/Fe in a film is set in the range of from 0.001 to 0.3, excellent magnetic characteristics can be obtained.

According to the literature 6, it is proposed to repeat a step in which after a reaction solution containing at least ferrous ion is brought into contact with a substrate, a solution containing at least an oxidant is brought into contact with the substrate, and thereby to form a ferrite film on a surface of the substrate; and it is said that thereby a formation rate of the ferrite film can be improved.

However, in the literature 6, no clear mention is made of a step of removing the reaction solution containing at least ferrous ion and the solution containing at least the oxidant.

Furthermore, a method is proposed in which a ferrite film is formed on a substrate having the center line average roughness Ra of 0.01 μm or more (for instance, JP-A No. 1-246149 (hereinafter referred to as "literature 10")).

In the case of the literature 10, in an embodiment thereof, it is disclosed that when a ferrite film is formed on a substrate having the center line average roughness Ra in the range of from 0.01 to 0.8 μm, a homogeneous film free from irregularity in a thickness can be obtained.

However, the ferrite films according to the above-mentioned existing processes, in view of applying to an inductance element, impedance element, magnetic head, microwave element, magnetostrictive element and electromagnetic interference suppressor in a high frequency region, are insufficient in the soft magnetic characteristics. Accordingly, a large problem existed as to applications or adaptations to various kinds of electronic components and so on. In order to overcome the problems, specifically, imparting a film a magnetic uniaxial anisotropy, optimizing a chemical composition of the film, and homogenizing the film become important points.

A film that is manufactured according to a general ferrite plating process (for instance, literature 1) does not have the magnetic directivity (isotropic); accordingly, when a constituent element of a ferrite film has the uniaxial anisotropy and the magnetic permeability thereof is assumed to be A, the magnetic permeability of as a whole film becomes about A/2 and excellent potential in the soft magnetic characteristics that the ferrite film intrinsically has cannot be extracted. Furthermore, in the case of a ferrite film that has the uniaxial anisotropy such as disclosed in the literature 8 being used in an inductance element, when for instance a spiral coil is used, a problem exists in that owing to the anisotropy of the magnetic film a portion where the magnetic flux density is locally lowered is generated inside of the element, as a result an inductance as a whole is lowered.

Furthermore, as mentioned above, various improvements have been proposed to improve a formation rate of a ferrite film; however, from an industrial productivity point of view, these are insufficient; accordingly, a large problem has been remained in the applications to various kinds of electronic components or in the adaptability thereto.

Still furthermore, in the above literatures 7 and 8 that pay attention to an improvement in the magnetic characteristics, in an embodiment that is a specific explanation thereof, there is a description that "a plating solution can be separately supplied"; however, all embodiments in, for instance, the literature 8 adopt a method in which a plurality of plating solutions is mixed before the ferrite crystallization and supplied to a substrate. Accordingly, it is supposed that because fine ferrite grains that are secondarily formed other than on a solid surface disturb the crystal growth or $Fe^{2+}$ is unevenly absorbed on a solid surface, a ferrite film that is an aggregation of homogeneous grains is obtained with difficulty.

Furthermore, the literature 9, though paying attentions to relationship between compositions and the magnetic characteristics, aims usage as magnetic recording media, intends to realize higher coercive force and higher residual magnetic flux density, but does not relate to a ferrite film that is used in an inductance element, impedance element, magnetic head, microwave element, magnetostrictive element and high frequency magnetic device; that is, the literature 9 is a technique that relates to one that is obviously different in the characteristics required for high frequency magnetic devices such as an electromagnetic interference suppressor that is used to suppress electromagnetic interference owing to unnecessary electromagnetic waves in the high frequency region.

On the other hand, in the case of the technique by which a ferrite film is formed on the above-mentioned substrate, in view of applications to recent magnetic devices, a magnetic substance that is used therefor, in the magnetic characteristics thereof, is necessary to be high specifically in the magnetic permeability. In order that a film that is obtained by the ferrite plating process may have high magnetic permeability, control of a composition of a film, in particular control of crystal orientation of grains that form the film is indispensable.

However, according to the above-mentioned existing processes, in all of the processes, a technique for controlling the crystal orientation that takes correlation with the magnetic characteristics into consideration is not introduced (that is, for instance, in the literature 10, no mention is made of correlation between the center line average roughness Ra of the substrate and the crystal orientation and the magnetic characteristics of the film; in the literature 3, there is described that in order to supply a homogeneous film excellent in the adhesiveness, a surface of the substrate is necessary to be plasma treated; furthermore, in the literature 7, the magnetic characteristics of a film that is obtained are taken into consideration, however no mention is made of steps of removing the reaction solution and the oxidizing solution and the correlation between the crystal structure and the magnetic characteristics of the film of the substrate and the surface roughness of the substrate); as a result, a problem exists in that high magnetic permeability cannot be obtained.

In the case of the ferrite film particularly due to the ferrite plating process, as mentioned above, the ferrite film is formed through crystal growth from a starting point on the surface of the substrate; however, according to the existing processes, since fine ferrite grains secondarily formed other than on the surface of the substrate disturb the crystal growth or $Fe^{2+}$ is unevenly absorbed on the surface of the substrate, the crystal orientation can be controlled with difficulty (for instance, as in the literature 10, when a ferrite film is formed on a surface of a substrate that is extremely small in the center line average roughness Ra, a homogeneous film can be obtained with difficulty, and the crystal orientation can be controlled with difficulty). As a result, in spite of various improvements so far being proposed to improve the formation rate of the film, these improvements are insufficient from a viewpoint of the industrial productivity. In addition to the above problem, there is a large technical problem in that when applying to the magnetic devices and adapting to various kinds of electronic components, high magnetic permeability cannot be obtained.

SUMMARY OF THE INVENTION

It is a first object of the present invention to provide, in ferrite films that are formed according to the ferrite plating process, with a formation rate improved and thereby industrial productivity increased, an extremely homogeneous ferrite film that has the uniaxial anisotropy and large magnetic permeability.

Furthermore, it is a second object of the present invention to provide, in ferrite films that are formed according to the ferrite plating process, with a formation rate improved and thereby industrial productivity increased, an extremely homogeneous ferrite film that does not have the magnetic directivity (isotropic).

Still furthermore, it is a third object of the present invention to provide a method of manufacturing the ferrite film.

Furthermore, it is a fourth object of the present invention to provide an electromagnetic noise suppressor in which the ferrite film is used.

Still furthermore, it is a fifth object of the present invention to provide a method of manufacturing the electromagnetic noise suppressor.

Furthermore, it is a sixth object of the invention to provide a homogeneous ferrite film that is controlled in the crystal orientation and high in the magnetic permeability, and a method of manufacturing the ferrite films according to the ferrite plating process with a formation rate improved and thereby industrial productivity increased.

According to one aspect of the present invention, there is provided a ferrite film in which magnetized grains or constituent elements analogous to that are regularly arranged.

Here, in the aspect of the present invention, the magnetic anisotropy or the magnetic isotropy is preferably possessed.

Furthermore, in the aspect of the present invention, the constituent element having the uniaxial anisotropy preferably includes Co.

Still furthermore, in the aspect of the present invention, the constituent element having the multiaxial anisotropy preferably includes Ni, Zn, Fe and O.

Furthermore, according to another aspect of the present invention, there is provided a ferrite film in which an intensity ratio of peaks corresponding to a (222) crystal lattice plane and a (311) crystal lattice plane in an X-ray diffraction pattern of a film surface, $I_{222}/I_{311}$. The intensity ratio is larger than 0.05.

Here, in the aspect of the present invention, at least one kind of Ni, Zn, Fe and O is preferably included.

Furthermore, according to still another aspect of the present invention, there is provided an electromagnetic noise suppressor provided with a ferrite film in which magnetized grains or constituent elements analogous to that are regularly arranged.

Here, in the above aspect of the present invention, the ferrite film is preferably formed directly or indirectly on a substrate of any one of a support, electronic wiring board and semiconductor integrated wafer, and furthermore, in the ferrite film, magnetized grains or constituent elements analogous to that are preferably regularly arranged.

According to yet another aspect of the present invention, there is provided a method of manufacturing a ferrite film in which magnetized grains or constituent elements analogous to that are regularly arranged. In the method of manufacturing the ferrite film, the ferrite film is formed in the presence of a magnetic field.

According to a further aspect of the present invention, there is provided a ferrite film which is formed in the presence of a revolving magnetic field.

Furthermore, according to a still further aspect of the present invention, there is provided a method of manufacturing a ferrite film in which magnetized grains or constituent elements analogous to that are regularly arranged. The method of manufacturing a ferrite thin film includes the steps of bringing a reaction solution containing at least ferrous ion into contact with a substrate, removing the reaction solution from the substrate, bringing an oxidizing solution containing at least an oxidant into contact with the substrate, and removing a residue that does not contribute to the formation of the ferrite film of the reaction solution and the oxidizing solution can be obtained.

Still furthermore, according to a yet further aspect of the present invention, there is provided a method of suppressing electromagnetic noise that uses an electromagnetic noise suppressor that is provided with a ferrite film having the magnetic anisotropy. In the aspect of the present invention, the ferrite film is disposed with an axis of easy magnetization in substantially parallel with a forwarding direction of a high frequency current or conducted noise that is a target of the electromagnetic noise suppression. Here, in the above aspect of the present invention, the ferrite film preferably has magnetized grains or constituent elements analogous to that that are regularly arranged, and the constituent elements preferably have the uniaxial anisotropy.

DESCRIPTION OF THE PREFERRED EMBODIMENTS

First Embodiment

First, the present invention will be detailed.

Figure 1A:
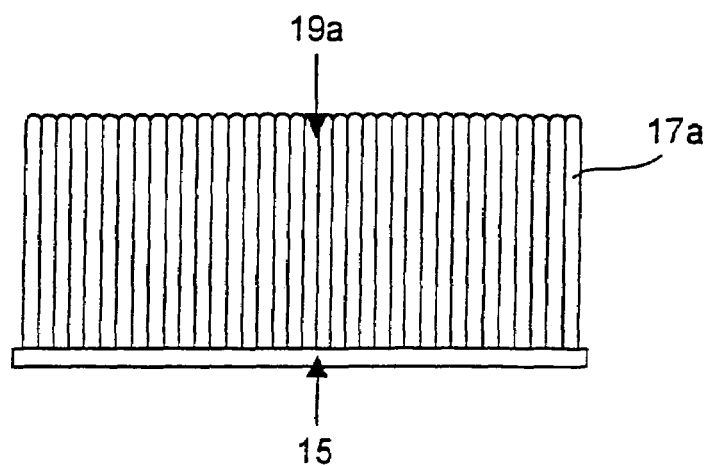
FIG. 1A is a schematic diagram showing columnar grains of a ferrite film involving the present invention.
Figure 1B:
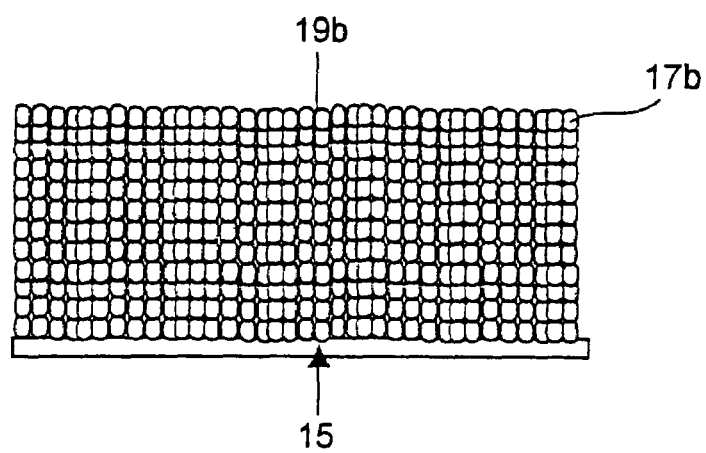
FIG. 1B is a schematic diagram showing particulate grains of a ferrite film involving the invention.
Figure 1C:
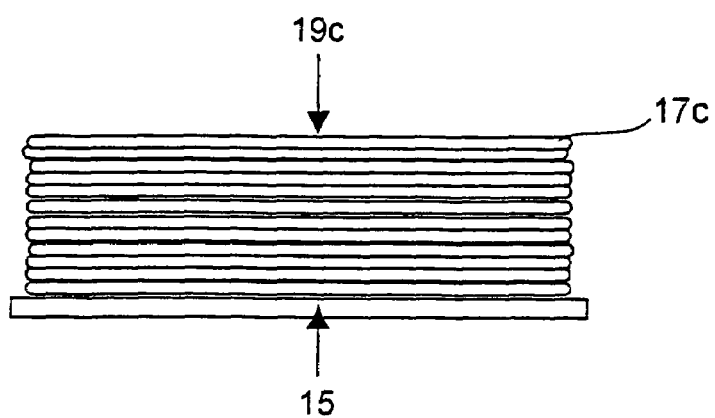
FIG. 1C is a schematic diagram showing layering grains of a ferrite film involving the invention.

As shown in FIG. 1A, in a ferrite film 19a formed on a substrate 15, columnar grains 17a constituting the film 19a or constituting elements analogous to that are very uniformly distributed in the film 19a. Furthermore, in FIG. 1B, in a ferrite thin film 19b formed on the substrate 15, particulate grains 17b constituting the film 19b or constituting elements analogous to that are very uniformly distributed in the film 19b. Still furthermore, in FIG. 1C, in a ferrite thin film 19c formed on the substrate 15, layering grains 17c constituting the film 19c or constituting elements analogous to that are very uniformly distributed in the film 19c.

According to the invention, a ferrite thin film in which constituents (grains or constituents analogous to that) constituting a ferrite film are regularly arranged is obtained; anisotropic directions of the constituents having the uniaxial anisotropy are aligned in a particular direction; and thereby an extremely homogeneous ferrite thin film having the uniaxial anisotropy in substantially parallel with a thickness direction of a thin film as a whole film or in substantially parallel with an in-plane direction of a thin film can be obtained. Furthermore, when the ferrite thin film, in addition to Ni, Zn, Fe and O, further contains Co, the soft magnetic characteristics can be improved.

Here, an amount of Co that is contained in the ferrite film involving the invention, by molar ratio, a value of Co/(Fe+Ni+Zn+Co), is 0/3 or more and 0.3/3 or less, and most preferably in the range of substantially from 0.01/3 to 0.1/3.

Furthermore, in the invention, in a thin film in which an axis of easy magnetization of an obtained film as a whole is in substantially parallel with a thickness direction of a ferrite thin film, all in-plane directions of the film become an axis of hard magnetization. Accordingly, excellent potential in the soft magnetic characteristics intrinsic to the film can be fully extracted, and furthermore high magnetic permeability that has the same value in all directions in a film plane can be obtained.

Still furthermore, in a thin film in which an axis of easy magnetization of an obtained film as a whole is in substantially parallel with an in-plane direction of a ferrite thin film, in a direction perpendicular to the axis of easy magnetization, excellent potential in the soft magnetic characteristics intrinsic to the film can be fully extracted and high magnetic permeability can be obtained.

Specifically, in the invention, when a method of manufacturing a ferrite film includes a step of bringing a reaction solution containing at least ferrous ion into contact with a substrate; a step of bringing an oxidizing solution containing at least an oxidant into contact with the substrate; a step of removing a residue that does not contribute to the formation of the ferrite film of the reaction solution and the oxidizing solution from the substrate; and furthermore a step of bringing a reaction solution and an oxidizing solution into contact with a surface of the substrate in a magnetic field, an extremely homogeneous ferrite thin film having the uniaxial anisotropy can be obtained with a formation rate improved and thereby industrial productivity increased and with the constituents (grains) constituting the film arranged regularly.

Reasons for the ferrite film according to the invention being obtained are considered as follows.

The ferrite film according to the ferrite plating process, as mentioned above, is formed through the crystal growth from a starting point on a solid surface. At this time, the ferrite film is a ferrite thin film in which constituents (grains or ones analogous to that) having the uniaxial anisotropy are regularly arranged. Accordingly, the reasons for the existing process described in the literature 1 giving birth to the isotropic film alone are considered to be in that crystal orientations imparting the constituents with the uniaxial anisotropy are random. According to the invention, by bringing, for instance, a reaction solution and an oxidizing solution into contact with a surface of a substrate in the presence of a magnetic field, directions of anisotropy of the constituents individually having the uniaxial anisotropy are (induced) aligned in a particular direction or uniaxial anisotropy is induced resulting from a peculiar distribution of Co ions, resulting in obtaining a film having the uniaxial anisotropy as a whole film.

Details of the reasons for the step of removing the reaction solution and the oxidizing solution improving the formation rate of the ferrite plating film and realizing homogeneous columnar grains are not clarified.

However, it is considered that the step of removing the reaction solution and the oxidizing solution suppress ferrite fine particles from being secondarily formed other than on the surface of the solid and allow $Fe^{2+}$ being uniformly absorbed on the solid surface.

Furthermore, as mentioned above, the literature 7 discloses a method of applying the ferrite plating in a magnetic field and thereby improving the soft magnetic characteristics, and the literature 8 discloses that the ferrite plating in the presence of a magnetic field gives birth to a film having the uniaxial anisotropy.

However, although there is such a description as that "plating solutions can be separately supplied" in embodiments, all embodiments adopt a method in which a plurality of plating solutions is mixed before the ferrite crystallization and supplied to a substrate. Accordingly, it is supposed that since fine ferrite particles secondarily formed other than on the solid surface disturb the crystal growth and $Fe^{2+}$ is unevenly absorbed on the solid surface, a ferrite film that is an aggregation of homogeneous grains can be obtained with difficulty.

Furthermore, as mentioned above, according to the literature 9, when a weight ratio of Co/Fe in the film is in the range of from 0.001 to 0.3, excellent magnetic characteristics can be obtained. However, the literature 9 is for use in magnetic recording medium and intends to realize higher coercive force and higher residual magnetic flux density. Accordingly, the usage and directionality are clearly different from that of the present invention.

Still furthermore, according to the literature 6, it is proposed that a step in which, after a reaction solution containing at least ferrous ion is brought into contact with a substrate, in the next place a solution containing at least an oxidant is brought into contact with the substrate is repeated, and thereby a ferrite film is formed on a surface of the substrate. According to the literature 6, thereby, a formation rate of the ferrite film can be improved.

However, in the literature 6, no clear description is made of a step of removing the reaction solution containing at least ferrous ion and the solution containing at least an oxidant.

According to the study of the present inventors, the step of removing the reaction solution containing at least ferrous ion and the solution containing at least an oxidant is very important and indispensable to improve the formation rate of the ferrite plating film and to form homogeneous grains.

Furthermore, because the ferrite plating film according to the invention has excellent magnetic loss characteristics in a high frequency region, the ferrite plating film can be used as an electromagnetic noise suppressor when formed singly or on a support. Furthermore, when the ferrite plating film is formed directly at least on one surface of an electronic wiring board or a semiconductor integrated wafer, an electronic wiring board or a semiconductor integrated wafer that can concurrently work as an electromagnetic noise suppressor can be realized. Still furthermore, when the ferrite film that constitutes an electromagnetic noise suppressor arranges an axis of easy magnetization in substantially parallel with a forwarding direction of a high frequency current (conducted noise) that is a target of the electromagnetic noise suppression, it can realize a method of more effectively suppressing the electromagnetic noise.

In the next place, a first embodiment of the invention will be specifically explained.

Figure 2:
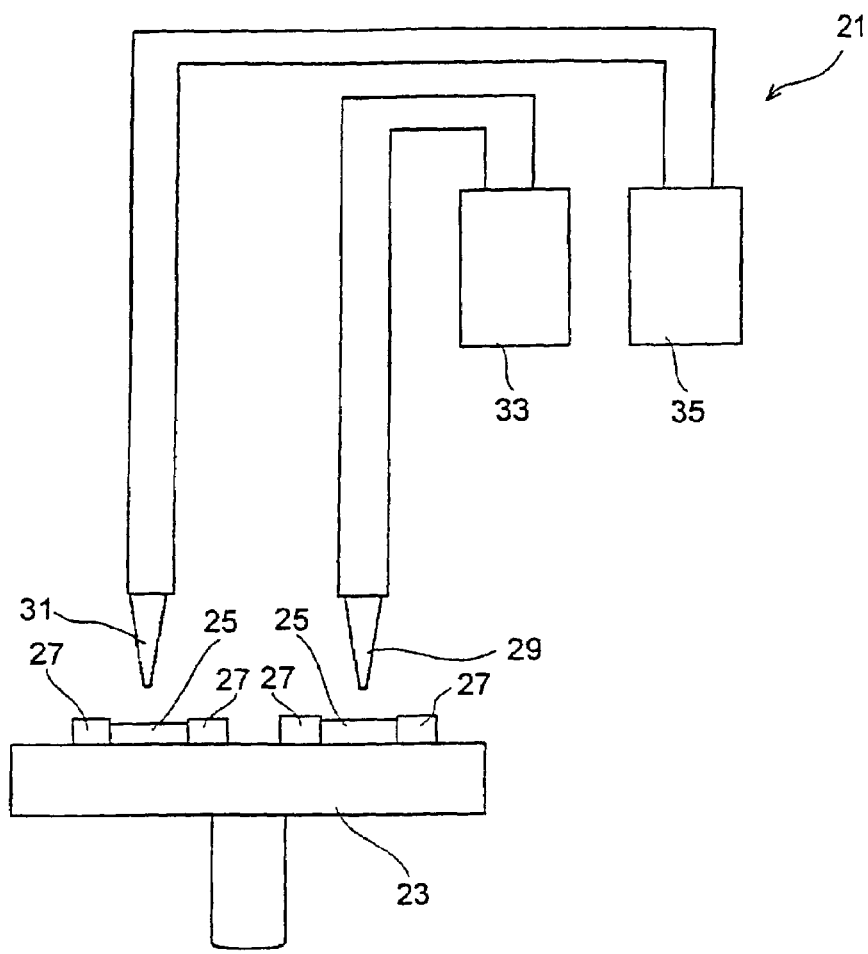
FIG. 2 is a schematic front view of an example of plating apparatus that was used in a first embodiment according to the invention.
Figure 3:
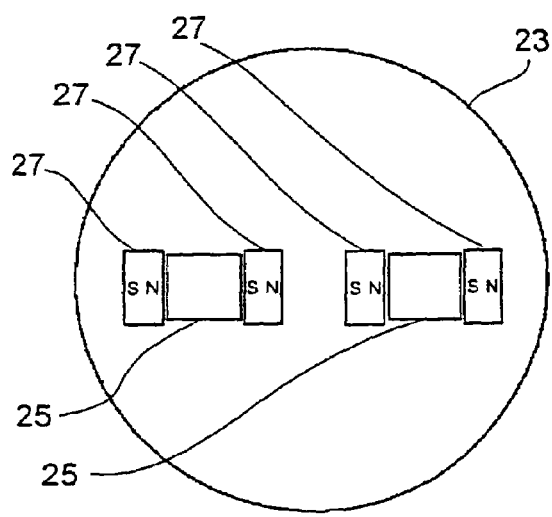
FIG. 3 is a layout diagram when the apparatus in FIG. 2 is seen from a direction vertical to a substrate.

With reference to FIGS. 2 and 3, on rotary table 23, substrates 25 thereon a ferrite film is formed are disposed sandwiched by magnets 27. The magnets 27 are disposed to apply a magnetic field to the substrates 25. Above the substrates 25, nozzles 29 and 31 for spraying a plating liquid to the substrates 25 are disposed, respectively, and the nozzle 29 and 31 are communicated with tanks for reserving the respective plating liquids. In order to efficiently removing the reaction solution and the oxidizing solution in the plating step, necessary solutions may be well prepared by dividing into several portions.

In an example shown in FIG. 2, a case where a solution necessary for the plating is divided into two is shown. Solutions reserved in tanks 33 and 35 are supplied through the nozzles 29 and 31, respectively, to the substrates 25. At that time, after the solution is supplied through, for instance, the nozzle 29 to the substrate 25, the supplied solution is removed by a centrifugal force due to rotation, the solution supplied through the nozzle 31 to the substrate 25 is removed by the centrifugal force due to rotation, and these steps are repeated.

Figure 4:
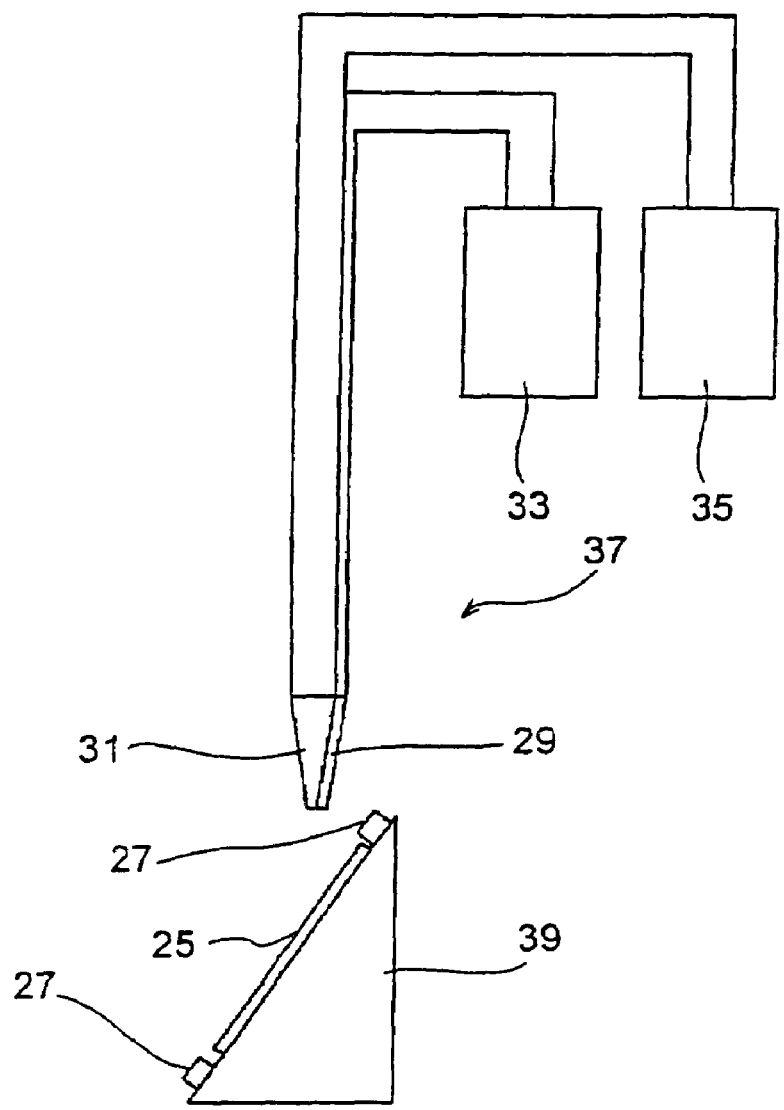
FIG. 4 is a schematic diagram of another example of plating apparatus according to the first embodiment of the invention.
Figure 5:
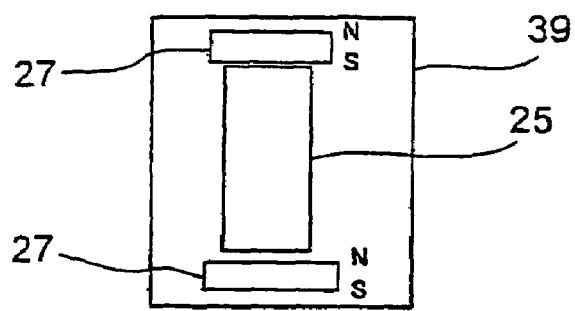
FIG. 5 is a layout diagram when the apparatus in FIG. 4 is seen from a direction vertical to a substrate.

Also in FIGS. 4 and 5, a case where in plating apparatus 37, when the reaction solution and the oxidizing solution are removed from the substrates, the fluidity imparted to the reaction solution and the oxidizing solution owing to gravity is utilized is shown.

Also in FIGS. 4 and 5, similarly to that described in FIGS. 2 and 3, the solutions reserved in the tanks 33 and 35 are supplied through the nozzles 29 and 31, respectively, to the substrates 25 disposed on a tilting table 39. At that time, after the solution is supplied through, for instance, the nozzle 29 to the substrate 25, the supplied solution is removed owing to the fluidity imparted to the solution by the gravity, after the solution is supplied through the nozzle 31 to the substrate 25, the supplied solution is removed owing to the fluidity imparted to the solution by the gravity, and these steps are repeated.

At that time, the magnets 27 apply a magnetic field to the substrates 25.

In the present embodiment, a magnetic field is applied in parallel with a direction in which the solution is removed; however, a magnetic field is applied which may be in any direction irrespective of a direction in which the solution is removed.

Furthermore, in the present invention, an example in which a step in which one solution is supplied followed by removing the supplied solution and the other solution is supplied followed by removing the supplied solution is repeated is shown; however, two solutions may be simultaneously supplied.

Next, examples of manufacturing ferrite films according to the invention will be specifically explained.

Example 1

With reference to FIGS. 2 and 3, on the rotary table 23, as the substrate 25, glass plates rendered hydrophilic by plasma treatment are disposed and heated to 90 degree centigrade under a rotation at 150 rpm and supply of deoxygenated ion exchange water. At that time, it was confirmed that on a surface of the substrate 25, a magnetic field of substantially 50 Oe is applied in substantially parallel with a film plane. In the next place, in the apparatus, $N_2$ gas was introduced and a deoxygenated atmosphere is established. Two kinds of reaction solutions were prepared. Into deoxygenated ion exchange water, $FeCl_2.4H_2O$, $NiCl_2.6H_2O$, $ZnCl_2$, and $CoCl_2.6H_2O$, respectively, were dissolved by 3.3, 1.3, 0.03, and 0.1 g/L, and thereby a solution A was prepared. Into deoxygenated ion exchange water, $FeCl_2.4H_2O$, $NiCl_2.6H_2O$, and $ZnCl_2$, respectively, were dissolved by 3.3, 1.3, and 0.03 g/L, and thereby a solution B was prepared. One of the reaction solutions A and B and an oxidizing solution that was prepared by dissolving $NaNO_2$ and $CH_3COONH_4$, respectively, in deoxygenated ion exchange water by 0.3 and 5.0 g/L were supplied from the nozzles at a flow rate of 30 ml/min for substantially 30 minutes. Thereafter, it was confirmed that on a taken out glass substrate, in all cases where the reaction solutions A is used and the reaction solution B is used, a black mirror-like film was formed; in the case of the reaction solution A being used, it was found to be ferrite made of Ni, Zn, Fe, Co and O; and in the case of the reaction solution B being used, it was found to be ferrite made of Ni, Zn, Fe, and O. An amount of Co that was contained in the ferrite film when the reaction solution A was used was 0.03/3 by a value of Co/(Fe+Ni+Zn+Co) by molar ratio. When the magnetic characteristics of the prepared ferrite films were measured, in both cases where the reaction solution A was used and the reaction solution B was used, a magnetization curve in a direction in parallel with a direction of a magnetic field had a shape that was a direction of easy magnetization. Furthermore, in both cases where the reaction solution A was used and the reaction solution B was used, a magnetization curve in a direction perpendicular to a magnetic field depicted a hysteresis loop in a direction of hard magnetization, that is, it was a uniaxial anisotropy ferrite film that has a direction of easy magnetization in a particular direction. However, the film that used the reaction solution A was remarkable in the difference of shapes of the hysteresis loops in a direction of hard magnetization and in a direction of easy magnetization.

Each of the obtained films was measured of a real part ($\mu'$) and an imaginary part ($\mu''$) of the magnetic permeability (in an axis of hard magnetization) and measurements shown in Table 1 were obtained.

TABLE 1

|  | Frequency | | | | | |
| --- | --- | --- | --- | --- | --- | --- |
|  | 20 MHz | | 500 MHz | | 1500 MHz | |
|  | $\mu'$ | $\mu''$ | $\mu'$ | $\mu''$ | $\mu'$ | $\mu''$ |
| Reaction solution A | 120 | 2 | 85 | 70 | 20 | 95 |
| Reaction solution B | 80 | 2 | 35 | 60 | 10 | 35 |

Both films show excellent soft magnetic characteristics; however, one that used the reaction solution A, having higher values of $\mu'$ and maintaining higher values of $\mu''$ over a very wide frequency range, exhibited excellent characteristics.

Comparative Example 1

For comparison purpose, with the magnets 27 removed from the apparatus such as shown in FIGS. 2 and 3, ferrite films were formed under the conditions the same as that of example 1 according to the invention. Thereafter, it was confirmed that in both cases where the reaction solution A was used and the reaction solution B was used, on a taken out glass substrate, a black mirror-like film was formed, and in the case of the reaction solution A, ferrite was made of Ni, Zn, Fe, Co and O, and in the case of the reaction solution B, ferrite was made of Ni, Zn, Fe and O. When the reaction solution A was used, an amount of Co that was contained in the ferrite film was 0.03/3 by a value of Co/(Fe+Ni+Zn+Co) by molar ratio. When the magnetic characteristics of the prepared ferrite film were measured, in both cases where the reaction solution A was and the reaction solution B was used, the magnetic characteristics were almost isotropic magnetically in an in-plane direction. Measurements of the real part ($\mu'$) and the imaginary part ($\mu''$) of the magnetic permeability of the obtained films are shown in the following Table 2.

TABLE 2

|  | Frequency | | | | | |
| --- | --- | --- | --- | --- | --- | --- |
|  | 20 MHz | | 500 MHz | | 1500 MHz | |
|  | $\mu'$ | $\mu''$ | $\mu'$ | $\mu''$ | $\mu'$ | $\mu''$ |
| Reaction solution A | 100 | 2 | 70 | 60 | 15 | 75 |
| Reaction solution B | 75 | 2 | 30 | 55 | 10 | 30 |

That is, a film in which the uniaxial anisotropy is isotropically dispersed such as obtained in comparative example 1 or a film of which constituents are considered to be isotropic, in comparison with the film such as obtained in embodiment 1 according to the invention in which directions of anisotropy of the constituents that individually have the uniaxial anisotropy are aligned in a particular direction and form a film having the uniaxial anisotropy as a whole film, exhibits smaller magnetic permeability.

Example 2

With reference to FIGS. 4 and 5, a glass plate rendered hydrophilic by plasma treating was disposed on tilting table 39 and was heated to 90 degree centigrade with deoxygenated ion exchange water supplying. Subsequently, $N_2$ gas was introduced into apparatus and a deoxygenated atmosphere was established. Reaction solutions and an oxidizing solution similar to that in example 1 of the invention were prepared. After flow rates of the reaction solution and the oxidizing solution were adjusted to 30 ml/min, one of the reaction solutions A and B was supplied from a nozzle for 0.5 seconds followed by removing the reaction solution owing to the fluidity imparted to the reaction solution by the gravity, and the oxidizing solution was supplied from a nozzle for 0.5 seconds followed by removing the oxidizing solution owing to the fluidity imparted to the reaction solution by the gravity. With the above processes inclusive as one cycle, 2000 cycles were repeated. Thereafter, it was confirmed that in both cases where the reaction solution A was used and the reaction solution B was used, on a taken out glass substrate, a black mirror-like film was formed, and in the case of the reaction solution A, ferrite was made of Ni, Zn, Fe, Co and O, and in the case of the reaction solution B, ferrite was made of Ni, Zn, Fe and O. When the reaction solution A was used, an amount of Co that was contained in the ferrite film was 0.03/3 by a value of Co/(Fe+Ni+Zn+Co) by molar ratio. When the magnetic characteristics of the prepared ferrite films were measured, in both cases where the reaction solution A was used and the reaction solution B was used, a magnetization curve in a direction in parallel with a direction of a magnetic field had a shape that was a direction of easy magnetization.

Furthermore, in both cases where the reaction solution A was used and the reaction solution B was used, a magnetization curve in a direction perpendicular to a magnetic field depicted a hysteresis loop in a direction of hard magnetization and showed to be a uniaxial anisotropy ferrite film having a direction of easy magnetization in a particular direction. However, the film that was formed by use of the reaction solution A was conspicuous in the difference of the shapes of the hysteresis loops in a direction of hard magnetization and in a direction of easy magnetization.

The real part ($\mu'$) and the imaginary part ($\mu''$) of the magnetic permeability in a direction of hard magnetization of the obtained films were measured and results shown in the following Table 3 were obtained.

TABLE 3

| | Frequency | | | | | |
|---|---|---|---|---|---|---|
| | 20 MHz | | 500 MHz | | 1500 MHz | |
| | $\mu'$ | $\mu''$ | $\mu'$ | $\mu''$ | $\mu'$ | $\mu''$ |
| Reaction solution A | 115 | 2 | 85 | 70 | 20 | 90 |
| Reaction solution B | 75 | 2 | 30 | 55 | 10 | 35 |

As shown in Table 3, both films exhibit excellent soft magnetic characteristics; however, one that was obtained by use of the reaction solution A, being high in $\mu'$ and also maintaining high values in $\mu''$ over a very wide frequency range, exhibited excellent characteristics.

In the above-mentioned examples 1 and 2 according to the invention, the reaction solutions and the oxidizing solution were removed owing to the centrifugal force or tilting of the substrate. However, as far as the reaction solution and the oxidizing solution can be uniformly removed, the fluidity imparted by supplying an inert gas or an inert gas containing oxygen may be used.

Furthermore, in examples 1 and 2 of the invention, a magnetic field was used as means for aligning a direction of anisotropy of constituents (grains) of the film in a particular direction; however, other means such as optimization of the crystal orientation and the surface roughness of a material that is used for, for instance, the substrate may be used.

Example 3

Figure 6:
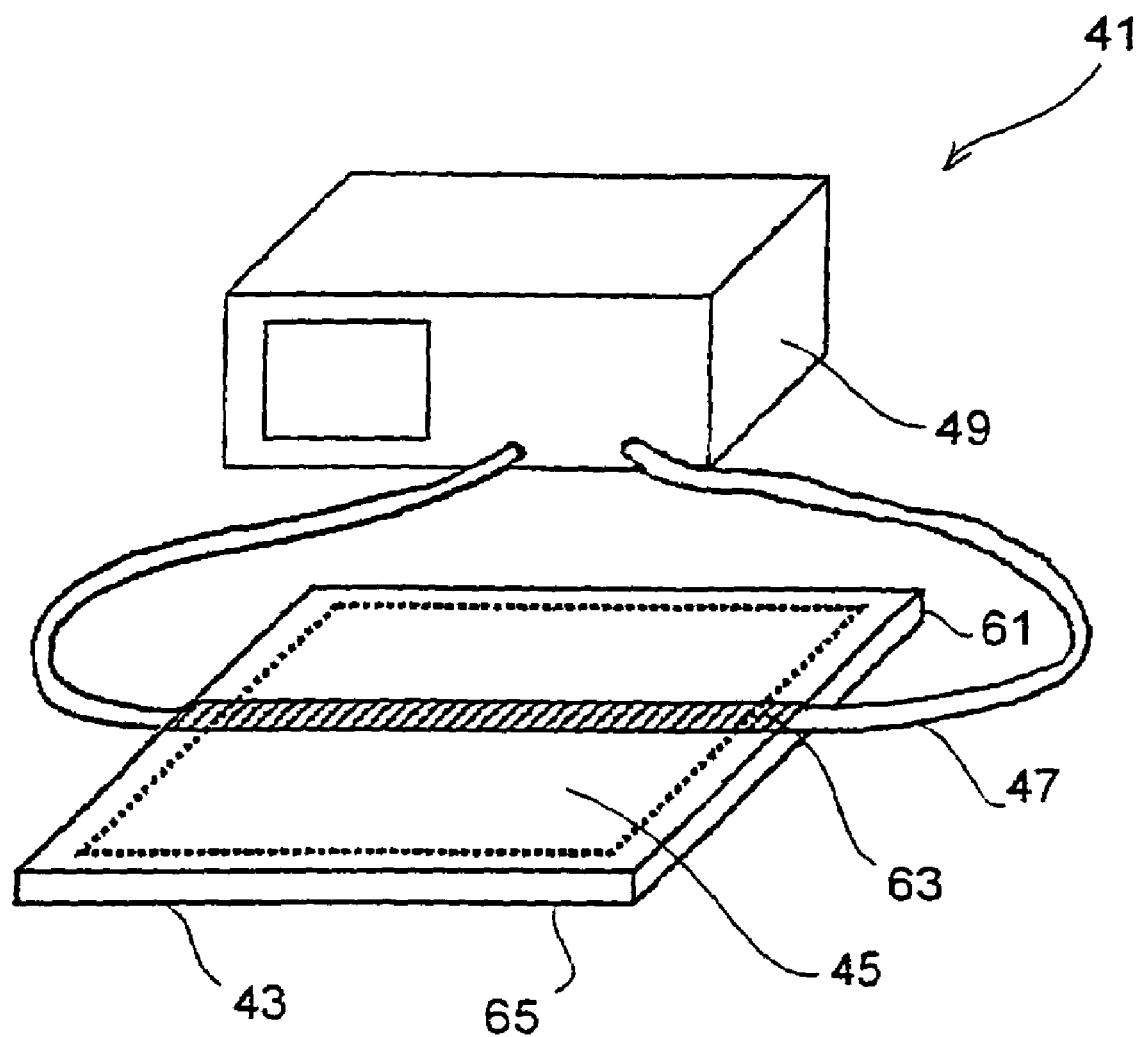
FIG. 6 is a schematic diagram of an evaluation system of an electromagnetic noise suppression effect of a ferrite thin film that was obtained according to the first embodiment of the invention.

FIG. 6 shows microstrip line (MSL) 43 that is used as a substrate when a ferrite thin film is formed and as a transmission line. The MSL 43 is provided with center conductor 63 having a width of substantially 3 mm at the center portion on a surface of a 1.6 mm thick and 80 mm square glass epoxy substrate 61 over an entire width of 80 mm and with grounding conductor 65 on a back surface thereof, and the characteristic impedance thereof is 50Ω.

Furthermore, on a front surface of the MSL 43, over a substantially entire surface, ferrite thin film 45 that was obtained by use of the reaction solution B in example 1 of the invention is directly formed. A direction of an axis of easy magnetization of the ferrite thin film 45 is matched in a direction of a line of the MSL 43.

The transmission characteristics when a sample was disposed on the MSL 43 were measured with both ends of the MSL 43 connected through coaxial cable 47 to network analyzer 49 and with the transmission characteristics of the MSL 43 alone as a reference.

Figure 7A:
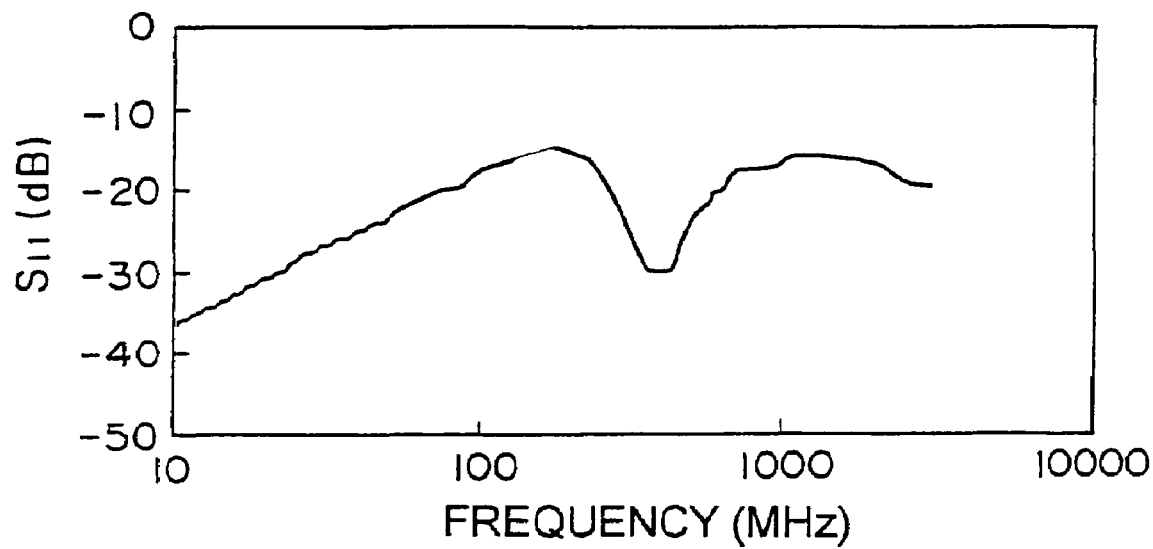
FIG. 7A is a diagram showing an evaluation example of an electromagnetic noise suppression effect of the ferrite thin film that was obtained according to the first embodiment of the invention and showing reflection characteristics (S11)

As shown in FIG. 7A, the reflection characteristics (S11), in spite of the ferrite thin film sample being formed with a large area, is sufficiently low in its value. Accordingly, it is considered to be a level that, even when the ferrite thin film is applied in an actual electronic circuit, does not adversely affect on transmission signals.

Figure 7B:
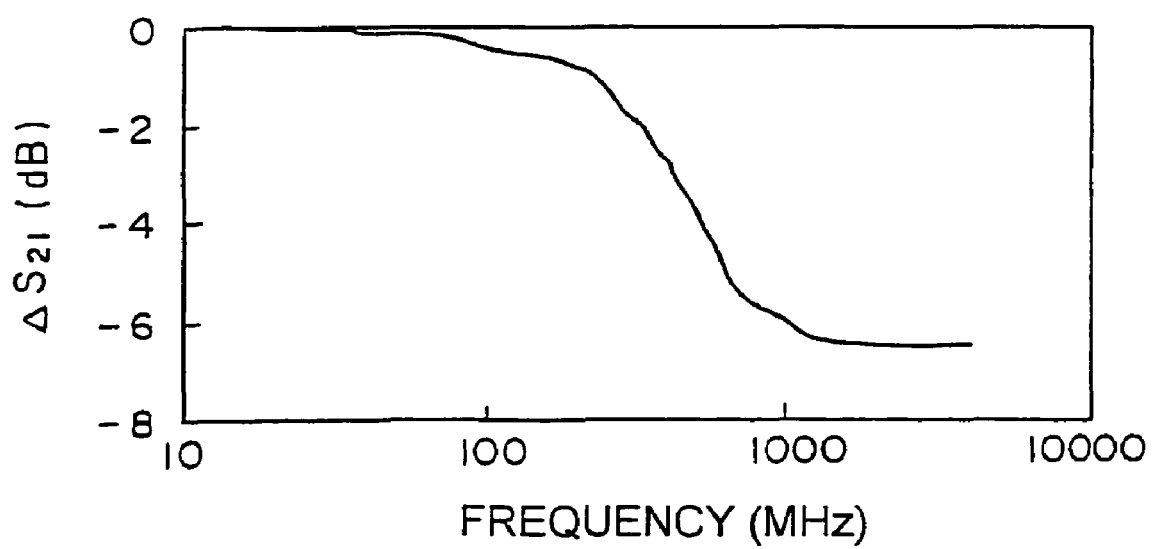
FIG. 7B is a diagram showing an evaluation example of an electromagnetic noise suppression effect of the ferrite thin film that was obtained according to the first embodiment of the invention and showing transmission characteristics (ΔS21)

Furthermore, as shown in FIG. 7B, the transmission characteristics (ΔS21) that are obtained by subtracting the transmission loss of the MSL 43 itself are confirmed to exhibit large attenuation on a high frequency side. From results shown in FIGS. 7A and 7B, it can be found that the ferrite thin film according to the invention, when formed in a transmission line, is effective as an electromagnetic noise suppressor that attenuates high frequency noise generated in an electronic device. Furthermore, the characteristics, by controlling an area, film thickness and composition of the thin film sample, can be controlled to desired characteristics.

As explained above, according to the first embodiment of the invention, when a ferrite thin film in which constituents (grains) constituting the film are regularly arranged is obtained and furthermore directions of anisotropy of the constituents having the uniaxial anisotropy are aligned in a particular direction, a very homogeneous ferrite thin film having as a whole film the uniaxial anisotropy in substantially parallel with a direction of a thickness of a thin film or in substantially parallel with an in-plane direction of the thin film can be obtained, and still furthermore when the ferrite thin film, though containing Ni, Zn, Fe and O, further contains Co, the soft magnetic characteristics can be improved.

Furthermore, according to the first embodiment of the invention, when a method of manufacturing a ferrite film is allowed to include bringing a reaction solution containing at least ferrous ion into contact with a substrate; bringing an oxidizing solution containing at least an oxidant into contact with the substrate; removing a residue that does not contribute to the formation of the ferrite film of the reaction solution and the oxidizing solution from the substrate; and furthermore bringing a reaction solution and an oxidizing solution into contact with a surface of the substrate in the presence of a magnetic field, a formation rate of the ferrite film is improved and thereby industrial productivity is increased, and an extremely homogeneous ferrite thin film that has the constituents (grains or constituents analogous to that) constituting the film regularly arranged and the uniaxial anisotropy can be obtained. Accordingly, the above manufacturing method is large in the industrial use value.

Still furthermore, when a ferrite plating film according to the first embodiment according to the invention is formed alone or on a support, alternatively when it is directly formed at least on one surface of an electronic wiring board or a semiconductor integrated wafer, an electromagnetic noise suppressor can be obtained.

Second Embodiment

First, a technical outline of another ferrite film according to the present invention will be briefly explained.

The present inventors, after variously studying, found that when a crystal orientation constituting a ferrite film is controlled, a ferrite film in which a ratio of peak intensities corresponding to a (222) crystal lattice plane and a (311) crystal lattice plane in the X-ray diffraction pattern of a surface of the film, $I_{222}/I_{311}$, is 0.05 or more can be obtained.

In the ferrite film, in order to obtain higher magnetic permeability, the ratio of peak intensities, $I_{222}/I_{311}$, is preferably made as large as possible. The reason for higher magnetic permeability being obtained when the ratio of peak intensities, $I_{222}/I_{311}$, is larger than 0.05 is considered to be related with that, when the ratio is less than 0.05, owing to the disorder of the crystal orientation of the ferrite film, potential that the individual grains intrinsically have cannot be sufficiently extracted as a whole film, or the homogeneity of the film is deteriorated or stress remains inside of the film.

Furthermore, it was found that in the ferrite film, at least one kind of Ni, Fe, Zn and O is contained. It is assumed that when one kind or more of these elements are deficient, an ion layout in a spinel lattice is largely affected, resulting in incapability of obtaining high magnetic permeability.

Furthermore, when such a ferrite film is manufactured, a ferrite film may be formed on a surface of a substrate having the center line average roughness Ra of larger than 0 and 10 µm or less according to the ferrite plating method. At this time, it was found that the ferrite film could be formed so that a ratio of peak intensities corresponding to the (222) crystal lattice plane and the (311) crystal lattice plane in the X-ray diffraction pattern of a surface of the film, $I_{222}/I_{311}$, might be larger than 0.05 and at least one kind of Ni, Zn, Fe and O might be contained. In the ferrite film, in order to obtain higher magnetic permeability, the center line average roughness Ra is preferably made as small as possible.

In addition, it was found that when according to the ferrite plating process, bringing a reaction solution containing at least ferrous ion into contact with a substrate; bringing an oxidizing solution containing at least an oxidant into contact with a substrate; and removing residue that does not contribute to the formation of a ferrite film of the reaction solution and the oxidizing solution from the substrate were repeated, and the reaction solution and the oxidizing solution were brought into contact with a surface of the substrate in the presence of a magnetic field, the film could be improved in the formation rate thereof and thereby could be industrially mass-produced. Furthermore it was also found that even in the case where after the crystal orientation was controlled according to the above-mentioned process, a homogeneous film could be obtained with difficulty, when a surface of the substrate was plasma treated in advance, a homogeneous film more controlled in the crystal orientation could be obtained.

In the method of manufacturing a ferrite film like this, the reason for the center line average roughness Ra being provided to be 10 µm or less is in that when the center line average roughness Ra is larger than 10 µm, the magnetic permeability is largely deteriorated. The reason for this is inferred to be in that a ratio of peak intensities corresponding to the (222) crystal lattice plane and the (311) crystal lattice plane in the X-ray diffraction pattern of a surface of the ferrite film, $I_{222}/I_{311}$, becomes less than 0.05. Furthermore, the reason for the center line average roughness Ra being provided to be larger than 0 is because in order to obtain higher magnetic permeability the center line average roughness Ra is preferably made as small as possible, and because even when the center line average roughness Ra is remarkably small and sufficient adherence and homogeneity cannot be obtained without applying the surface treatment, the plasma treatment of a surface of the substrate enables to obtain a desired film.

An effect of previously applying plasma treatment on a surface of a substrate is present in that by forming an oxygen-containing layer on a surface of the substrate $Fe^{2+}$ absorption can be accelerated. The plasma treatment of the surface of the substrate is not a necessary condition for manufacturing the above-mentioned homogeneous film. However, there are cases where sufficient adherence and homogeneity cannot be obtained without treatment; that is, for instance, when the center line average roughness Ra of the surface of the substrate is extremely small, or there is no sufficient oxygen-containing surface layer that allows $Fe^{2+}$ being uniformly absorbed on a surface of the substrate. In these cases, application of the plasma treatment allows to eliminate these inconveniences. As the plasma for use in plasma treatment, as a type of discharge, glow discharge, corona discharge, boxer charger and so on can be used. As a plasma gas, one kind or more of non-oxidizing gases such as nitrogen, argon, helium, ammonia, and carbon tetrafluoride can be used; and as an oxygen-containing gas, one kind or two kinds or more of oxygen, carbon dioxide, carbon monoxide, nitrogen dioxide, sulfur dioxide, and air can be used. In the case of the non-oxidizing gas being used as a plasma gas, when a solid surface thereon free radicals are generated by the plasma treatment is exposed to air, on a surface of the substrate, an oxygen-containing surface layer can be formed.

The reason why the step of removing residue that does not contribute to the formation of the ferrite film of the reaction solution and the oxidizing solution that is introduced in the ferrite plating process improves a formation rate of the film and enables to form a homogeneous film is not clearly understood; however, it can be inferred that these steps suppress ferrite fine particles from being secondarily formed other than on a solid surface, in addition, have a function of allowing $Fe^{2+}$ to be uniformly absorbed on a solid surface.

Furthermore, according to the method of manufacturing the ferrite film according to the invention, basically, a step in which one solution of a reaction solution and an oxidizing solution is supplied followed by removing the supplied solution and the other solution is supplied followed by removing the supplied solution is repeated; however, other than this, a step in which two solutions are supplied simultaneously followed by removing may be repeated.

According to the second embodiment, when the crystal orientation constituting the ferrite film is controlled, a ferrite film in which a ratio of peak intensities corresponding to the (222) crystal lattice plane and the (311) crystal lattice plane in the X-ray diffraction pattern of a surface of the film, $I_{222}/I_{311}$, is 0.05 or more can be obtained.

In the following, several ferrite films involving the second embodiment of the invention will be specifically explained including manufacturing methods thereof.

Example 4

Figure 8:
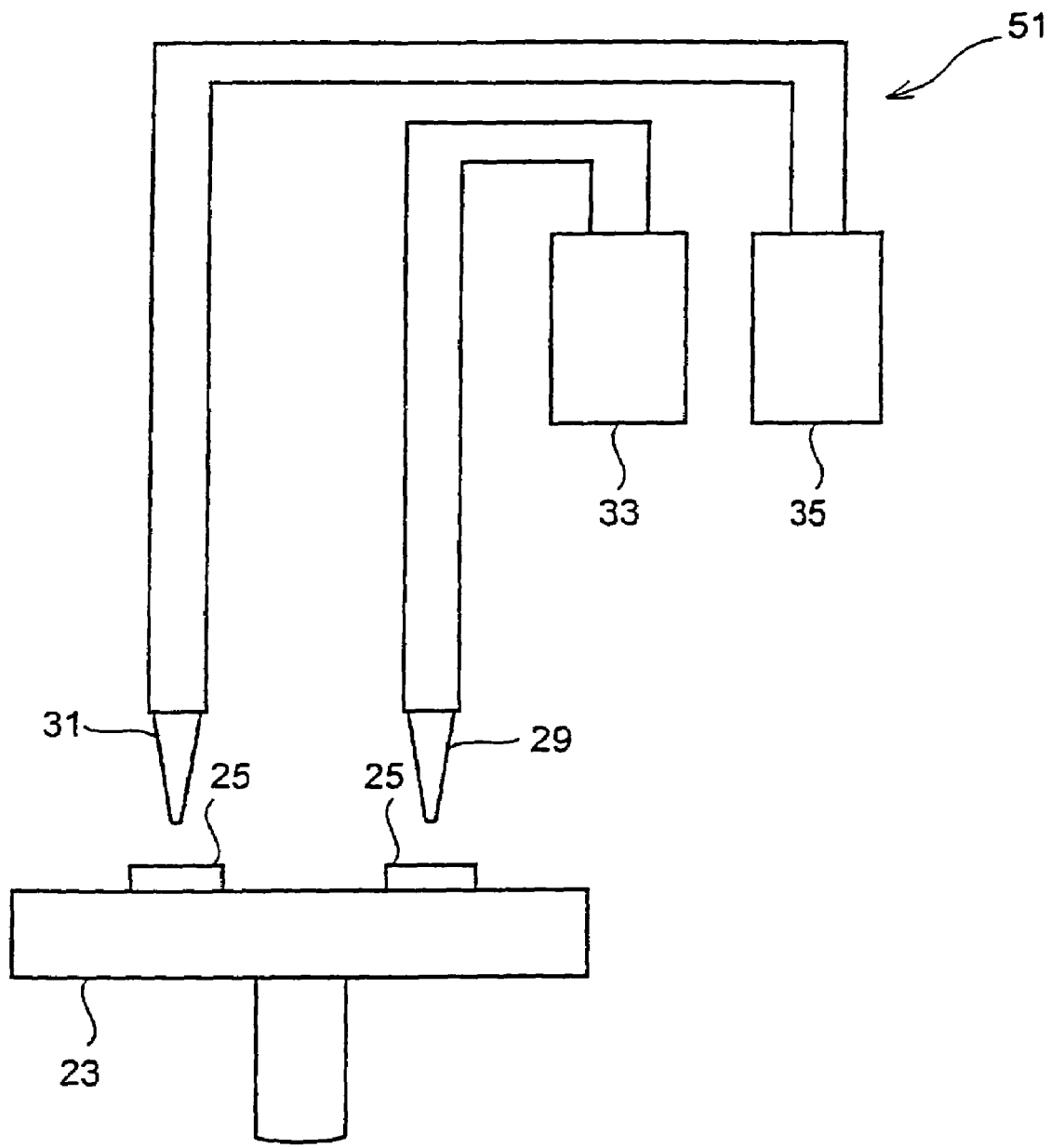
FIG. 8 is a side view showing a basic configuration of ferrite film formation apparatus according to a second embodiment of the invention.

With reference to FIG. 8, ferrite film formation apparatus 51 is constituted with two substrates 25, 25 on which a ferrite film is formed disposed on a rotary table 23 and with tip ends of nozzles 31 and 29 attached to tanks 33 and 35 that reserve solutions necessary for the plating disposed in proximity to the neighborhood of the substrates 25, 25. The solutions that are reserved in the tanks 33 and 35, in order to efficiently carry out a step of removing the residue that does not contribute to the generation of a ferrite film of the reaction solution and the oxidizing solution that are introduced in the ferrite plating process, are divided in two. When a ferrite film is being manufactured, the necessary solution is well prepared by dividing into several portions.

In the case of this ferrite film formation apparatus, when solutions from severally divided reaction solution and oxidizing solution reserved in tanks 33 and 35 are supplied through the nozzles 31 and 29 to the respective substrates 25, 25, a process in which, after the solution supplied through, for instance, the nozzle 29 to the substrate 25 is removed by a centrifugal force due to the rotation of the rotary table 23, the solution supplied through the nozzle 31 to the substrate 25 is similarly removed by a centrifugal force due to the rotation of the rotary table 23 is repeated. In the above, two different kinds of solutions are supplied from the tanks 33 and 35 through two channels of nozzles 31 and 29 to two substrates 25, 25. Instead, the apparatus may be constituted so that different three or more kinds of solutions may be supplied from three or more tanks through three or more channels of nozzles to three or more substrates 25, 25. Furthermore, in the above explanation, a process in which one of the reaction solution and the oxidizing solution is supplied followed by removing the supplied solution and the other solution is supplied followed by removing the supplied solution is repeated. Instead, a process in which two solutions are simultaneously supplied followed by removing may be repeated. Still furthermore, in the above explanation, by making use of the centrifugal force, the reaction solution and the oxidizing solution are removed from the substrate 25. Instead, the respective solutions may be removed by use of the fluidity imparted to the reaction solution and the oxidizing solution through the gravity.

In the ferrite film formation apparatus having a basic configuration like this, first, on the rotary table 23, as several different kinds of substrates 25, 25, a glass epoxy substrate A having the center line average roughness Ra of substantially 15 µm, a glass epoxy substrate B having the center line average roughness Ra of substantially 1 µm and a glass substrate C that is rendered hydrophilic by the plasma treatment and has the center line average roughness Ra of less than 0.1 µm are disposed, and under rotation at the number of revolution of 150 rpm and with deoxygenated ion exchange water supplying, heated up to 90 degree centigrade.

Subsequently, $N_2$ gas is introduced in the ferrite film formation apparatus and thereby a deoxygenated atmosphere is established. Thereafter, as the reaction solution, a solution in which $FeCl_2 \cdot 4H_2O$, $NiCl_2 \cdot 6H_2O$ and $ZnCl_2$, respectively, are dissolved by 3.3, 1.3, and 0.03 g/L in deoxygenated ion exchange water is prepared; an oxidizing solution in which $NaNO_2$ and $CH_3COONH_4$, respectively, are dissolved by 0.3 and 5.0 g/L in deoxygenated ion exchange water is prepared; and, from tanks 33 and 35 in which the reaction solution and the oxidizing solution that are necessary for the plating are reserved, through the nozzles 29 and 31, the respective solutions are supplied at a flow rate of 30 ml/min for substantially 180 minutes to form a film. In the processing here, a reaction solution contact step, a reaction solution removal step, an oxidizing solution contact step and an oxidizing solution removal step according to the above ferrite plating process are repeated; however, as needs arise, the reaction solution in the reaction solution contact step and the oxidizing solution in the oxidizing solution contact step may be brought into contact with a surface of the substrate 25 in the presence of a magnetic field.

Thereafter, it was confirmed that a black film was formed on each of taken out substrates and the film was made of a ferrite film involving one of various kinds of samples made of Ni, Zn, Fe and O. As a result of texture observation with a scanning electron microscope (SEM), it was confirmed that a texture having a uniform film thickness was formed.

The magnetic permeability (real part µ' and imaginary part µ") of these ferrite films involving the respective obtained samples were measured and results shown in Table 4 were obtained.

TABLE 4

|  | Surface roughness (µm) | Frequency = 20 MHz | | Frequency = 500 MHz | | Frequency = 1500 MHz | |
| --- | --- | --- | --- | --- | --- | --- | --- |
|  |  | µ' | µ" | µ' | µ" | µ' | µ" |
| Substrate A | 15 | 20 | 2 | 20 | 2 | 15 | 10 |
| Substrate B | 1 | 45 | 2 | 20 | 35 | 15 | 30 |
| Substrate C | <0.1 | 60 | 2 | 20 | 50 | 5 | 30 |

From Table 4, it is found that ferrite films formed on the glass epoxy substrate B (referred to simply as "substrate B") and the glass substrate C (referred to simply as "substrate C") exhibit excellent soft magnetic characteristics; however, in the case of a ferrite film formed on the glass epoxy substrate A (referred to simply as "substrate A"), both the real part µ' in a relatively low frequency (20 MHz) and the imaginary part in a relatively high frequency (500 MHz and 1500 MHz) are low, that is, the soft magnetic characteristics are remarkably deteriorated. Accordingly, the ferrite films formed on the substrates B and C that are excellent in the soft magnetic characteristics in the high frequency region are target samples involving embodiments of the present invention.

Furthermore, Cu Kα X-ray diffraction patterns of surfaces of the ferrite films involving the respective obtained samples were evaluated and results shown in Table 5 were obtained.

TABLE 5

|  | Surface roughness Ra (µm) | Peak intensity ratio $I_{222}/I_{311}$ |
| --- | --- | --- |
| Substrate A | 15 | 0.05 |
| Substrate B | 1 | 0.07 |
| Substrate C | <0.1 | 10 |

From Table 5, it is found that there is a tendency in that a ratio of peak intensities corresponding to a crystal lattice plane (222) and a crystal lattice plane (311), $I_{222}/I_{311}$, becomes smaller in its value as the center line average roughness Ra (referred to simply as "surface roughness Ra") of the substrate becomes larger. Accordingly, the ferrite films formed on the substrates B and C of which peak intensity ratios $I_{222}/I_{311}$ exceed 0.05 are target samples involving embodiments of the present invention.

Comparative Example 2

Now, as comparative example 2, in the ferrite film formation apparatus 51 as shown in FIG. 8, similarly, first, on a rotary table 23, as a substrate 25, a glass substrate D that is not rendered hydrophilic by the plasma treatment and has the center line average roughness Ra of less than 0.1 µm was disposed, and a film was formed under the same conditions as in the above embodiment. Thereafter, it was confirmed that on a taken out substrate a black film was formed and the black film was a ferrite film made of Ni, Zn, Fe and O. However, according to results of the texture observation by use of a scanning electron microscope (SEM), it was confirmed that, in addition to the ferrite film on the glass substrate D being uneven in the film thickness in comparison with that on the glass substrate C obtained according to embodiment 1, the texture homogeneity was extremely deteriorated.

Also with the ferrite film involving the sample obtained here, magnetic permeability (real part µ' and imaginary part µ") at predetermined high frequencies (20 MHz, 500 MHz and 1500 MHz) was measured and compared with that of the ferrite film formed on the glass substrate C obtained according to the previous embodiment, results shown in the following Table 6 were obtained.

TABLE 6

| | Plasma treatment | Surface roughness (µm) | Frequency = 20 MHz | | Frequency = 500 MHz | | Frequency = 1500 MHz | |
|---|---|---|---|---|---|---|---|---|
| | | | µ' | µ" | µ' | µ" | µ' | µ" |
| Substrate C | Yes | <0.1 | 60 | 2 | 20 | 50 | 5 | 30 |
| Substrate D | No | <0.1 | 20 | 2 | 20 | 3 | 15 | 10 |

From table 6, it is found that the ferrite film formed on the glass substrate D (referred to simply as "substrate D") is low both in the real part µ' in a relatively low frequency (20 MHz) and the imaginary part µ" in relatively high frequencies (500 MHz and 1500 MHz), that is, the soft magnetic characteristics are remarkably deteriorated.

Comparative Example 3

In the next place, as comparative example 3, with the ferrite film formation apparatus 51 such as shown in FIG. 8, similarly, first, on a rotary table 23, as a substrate 25 a glass substrate C rendered hydrophilic by the plasma treatment and having the center line average roughness Ra of less than 0.1 µm was disposed; and, under the conditions the same as that of the above-mentioned embodiment except for a solution in which $FeCl_2 \cdot 4H_2O$ and $ZnCl_2$, respectively, are dissolved by 3.3 and 0.03 g/L in deoxygenated ion exchange water being used as the reaction solution, a film was formed. Thereafter, it was confirmed that on a taken out substrate a black film was formed and the black film was a ferrite film made of Zn, Fe and O. Furthermore, also according to results of the texture observation by use of a scanning electron microscope (SEM), it was confirmed that a texture homogeneous in the film thickness was obtained. However, when the magnetic permeability (real part µ' and imaginary part µ") was measured of the obtained ferrite film in the high frequency zone, it was found that the magnetic permeability was substantially 1. Here, whether the reaction solution contains $NiCl_2 \cdot 6H_2O$ as in the previous embodiment or not is a point. As a result, it is shown that the difference of the composition of the reaction solution largely affects on the soft magnetic characteristics of the ferrite films that are formed.

Comparative Example 4

Furthermore, as separate comparative example 4, with the ferrite film formation apparatus 51 such as shown in FIG. 8, similarly, first, on the rotary table 23, as the substrate 25, a glass substrate C that is rendered hydrophilic by the plasma treatment and has the center line average roughness Ra of less than 0.1 µm was disposed, and a film was formed under the same conditions as in the above embodiment except for the number of revolutions of the rotary table 23 being set at 20 rpm. Thereafter, it was confirmed that on a taken out substrate a ferrite film was formed; however, according to results of the texture observation by use of a scanning electron microscope (SEM), it was confirmed that, in addition to a film thickness being very uneven, the homogeneity of the texture was very much deteriorated.

Also with the ferrite film involving the sample obtained here, the magnetic permeability (real part µ' and imaginary part µ") at predetermined high frequencies (20 MHz, 500 MHz and 1500 MHz) was measured and compared with that of the ferrite film formed on the glass substrate C obtained according to the previous embodiment, and results shown in the following Table 7 were obtained.

TABLE 7

| | Number of revolutions (rpm) | Surface roughness (µm) | Frequency = 20 MHz | | Frequency = 500 MHz | | Frequency = 1500 MHz | |
|---|---|---|---|---|---|---|---|---|
| | | | µ' | µ" | µ' | µ" | µ' | µ" |
| Substrate C | 150 | <0.1 | 60 | 2 | 20 | 50 | 5 | 30 |
| Substrate C | 20 | <0.1 | 10 | 2 | 10 | 2 | 10 | 2 |

From table 7, it is found that although the rotation function of the rotary table 23 of the ferrite film formation apparatus shown in FIG. 8 has an operation of applying a centrifugal force on the surface of the substrate, in the case of the glass substrate C of which number of revolutions is relatively small (number of revolutions: 20 rpm), in comparison with the glass substrate C according to the previous embodiment where the number of revolutions is relatively large (number of revolutions: 150 rpm), the magnetic permeability (real part µ' and imaginary part µ") was remarkably deteriorated in the high frequency zone. Accordingly, the present result shows that, when the ferrite plating process is introduced to form a ferrite film, that is, when the steps of bringing the reaction solution containing at least ferrous ion into contact with the substrate, of bringing the oxidizing solution containing at least an oxidant into contact with the substrate and of removing the residue that does not contribute to the formation of the ferrite film of the reaction solution and the oxidizing solution from the substrate are repeated to form the ferrite film, the application of the centrifugal force larger than a predetermined value is indispensable for efficiently mass-producing the ferrite films having excellent texture with an increased formation rate of the films.

As mentioned above, according to the second embodiment of the invention, when a ferrite film is formed on a surface of a substrate having the center line average roughness Ra of 0 or more and 10 µm or less according to the ferrite plating process, on the basis where the ferrite film is formed so that a ratio of peak intensities corresponding to a (222) crystal lattice plane and a (311) crystal lattice plane in the X-ray diffraction pattern of a surface of the substrate, $I_{222}/I_{311}$, may be larger than 0.05 and at least one kind of Ni, Zn, Fe and O may be contained, in addition to the above, according to the ferrite plating process, the step of bringing the reaction solution containing at least ferrous ion into contact with the substrate, the step of bringing the oxidizing solution containing at least an oxidant into contact with the substrate and the step of removing the residue that does not contribute to the formation of the ferrite film of the reaction solution and the oxidizing solution from the substrate are repeated. Accordingly, the homogeneous ferrite film that is controlled in the crystal orientation and has high magnetic permeability can be mass-produced with an improved formation rate, resulting in being industrially very advantageous.

Third Embodiment

Subsequently, still another invention will be specifically explained.

In the present invention, a ferrite thin film in which constituents that constitutes a ferrite film, for instance, grains or constituents analogous to that, are regularly arranged is obtained; furthermore an extremely homogeneous ferrite film of which constituents have the uniaxial anisotropy or multi-axial anisotropy and that is, as a whole film, in an in-plane direction of the thin film, magnetically isotropic can be obtained; and although the ferrite thin film contains Ni, Zn, Fe and O, when Co is further contained, the soft magnetic characteristics can be improved.

As to an amount of Co that is contained in the ferrite film according to the invention, by a molar ratio, a value of Co/(Fe+Ni+Zn+Co) is 0/3 or more and 0.3/3 or less, and most preferably substantially from 0.01/3 to 0.1/3.

In another mode of the invention, the step of removing the reaction solution and the oxidizing solution allows improving the formation rate of the ferrite plating film and forming homogeneous columnar grains; however, the details thereof are not clarified. However, it is considered that the step of removing the reaction solution and the oxidizing solution suppresses ferrite fine grains from being secondarily formed other than on the solid surface and allows $Fe^{2+}$ to be homogeneously absorbed on the solid surface.

As mentioned above, for instance, the literatures 7 and 8 disclose a method of improving the soft magnetic characteristics by applying the ferrite plating in a magnetic field; in particular, the literature 8 describes that when the ferrite plating is applied in a magnetic field, a film having the uniaxial anisotropy can be obtained.

In embodiments according to the literatures 7 and 8, there is a description that "a plating solution may be separately supplied"; however, all embodiments in the literatures adopt a method in which a plurality of plating solutions is mixed before the ferrite crystallization and supplied to a substrate. Accordingly, it is inferred that because ferrite fine grains that are secondarily formed other than on a solid surface disturb the crystal growth and $Fe^{2+}$ is unevenly absorbed on a solid surface, a ferrite film that is an aggregation of homogeneous grains may be obtained with difficulty. Furthermore, since a direction of an applied magnetic field is directed in one direction, it is different from still another mode of the invention.

According to, for instance, the literature 9, there is a description that excellent magnetic characteristics can be obtained when a weight ratio of Co/Fe in the film is in the range of from 0.001 to 0.3. However, since the usage is for magnetic recording media, the invention of the literature 9 intends to obtain higher coercive force and higher residual magnetic flux density; that is, the literature 9 is clearly different from still another mode of the present invention in the usage and the directionality.

Furthermore, according to, for instance, the literature 6, a process is proposed in which a step where a reaction solution containing at least ferrous ion is brought into contact with the substrate followed by bringing an oxidizing solution containing at least an oxidant into contact with the substrate is repeated, and thereby a ferrite film is formed on a surface of the substrate; and it is said that thereby the formation rate of the ferrite film can be improved. However, in the literature 6, the step of removing the reaction solution containing at least ferrous ion and the oxidizing solution containing at least an oxidant is not clearly described.

According to the study of the present inventors, the step of removing the reaction solution containing at least ferrous ion and the solution containing at least an oxidant is very important and indispensable in improving the formation rate of the ferrite plating film and in forming homogeneous grains.

Furthermore, because the ferrite plating film according to the invention has excellent magnetic loss characteristics in a high frequency region, the ferrite plating film, when formed singly or on a support, can be used as an electromagnetic noise suppressor; and furthermore, when the ferrite plating film is formed directly at least on one surface of an electronic wiring board or a semiconductor integrated wafer, an electronic wiring board or a semiconductor integrated wafer concurrently working as an electromagnetic noise suppressor can be realized.

In the next place, a third embodiment according to the invention will be explained.

Figure 9:
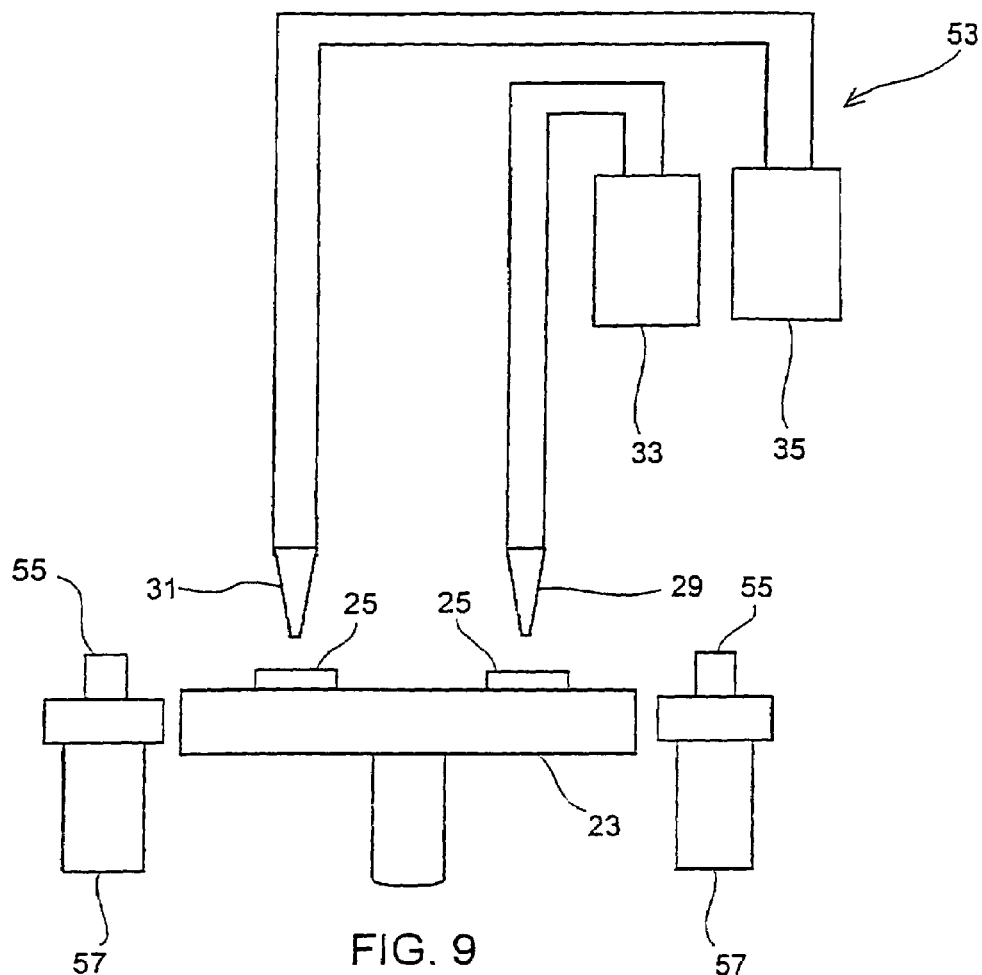
FIG. 9 is a schematic front view of an example of apparatus according to a third embodiment of the invention.
Figure 10:
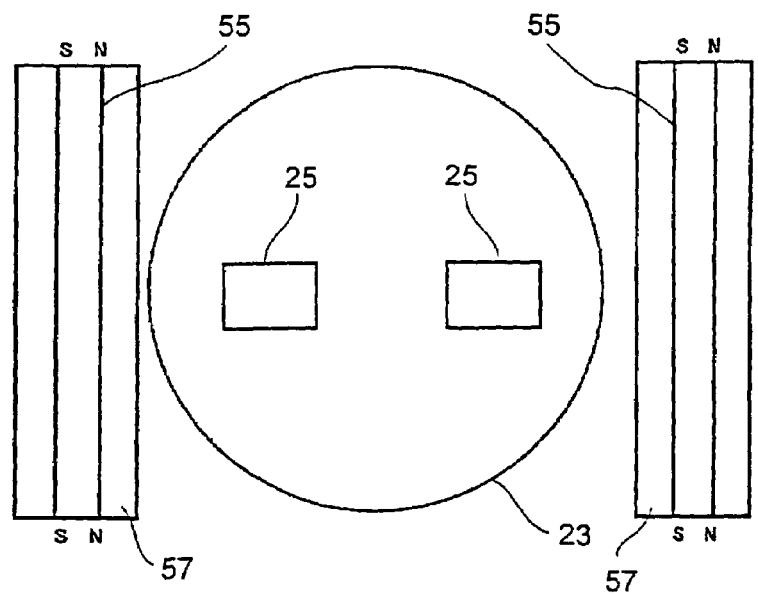
FIG. 10 is a layout diagram when the apparatus of FIG. 9 was seen from a direction vertical to the substrate.

With reference to FIGS. 9 and 10, in plating apparatus, on rotary table 23, substrates 25 thereon a ferrite film is formed are disposed. On both sides of the rotary table 23, magnets 55 are disposed and play the role of applying a magnetic field to the substrates 25. Furthermore, the magnets 55 are fixed on magnet supporting tables 57 independently from the rotary table 23 and independently from the revolution of the rotary table 23 a magnetic field is applied in one direction. Above the substrates 25, in order to supply plating solutions reserved in tanks 35 and 33, respectively, to the substrates 25, nozzles 29 and 31 connected to the tanks 33 and 35 are respectively disposed.

In order to efficiently remove the reaction solution and the oxidizing solution in the plating step, necessary solutions may be well prepared by dividing into several portions. Furthermore, in FIGS. 9 and 10, a case where a solution necessary for the plating is divided into two is shown.

Solutions reserved in the tanks 33 and 35 are supplied through the nozzles 29 and 31 to the substrates 25. At that time, a step in which after the solution is supplied through, for instance, the nozzle 31 to the substrate 25, the supplied solution is removed by a centrifugal force due to revolution, and the solution supplied through the nozzle 29 to the substrate 25 is removed by the centrifugal force due to revolution is repeated.

For comparison purpose, an example that uses the apparatus shown in FIGS. 4 and 5 that were used in the first embodiment will be explained.

With reference to FIGS. 2 and 3, on rotary table 23, substrates 25 thereon a ferrite film is formed are disposed. Also magnets 55 are disposed on the rotary table 23, revolve together with the substrates 25 and play the role of applying a magnetic field to the substrates 25. The magnetic field that is applied on the substrates 25 is adjusted so as to be the same as that in FIG. 9.

Figure 11:
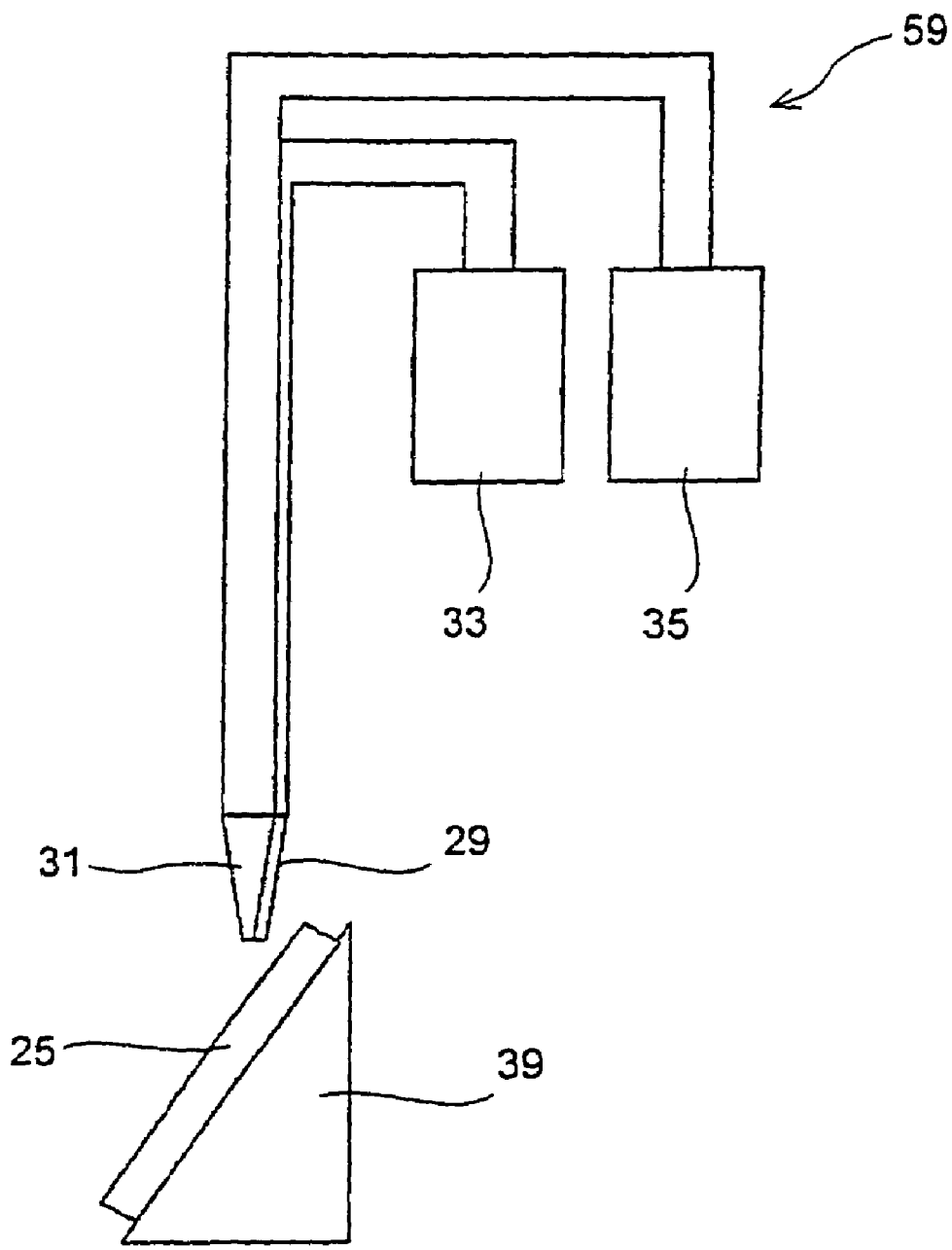
FIG. 11 is a schematic diagram of another example of apparatus according to the third embodiment of the invention.

With reference to FIG. 11, plating apparatus according to still another example according to the third embodiment of the invention uses, when the reaction solution and the oxidizing solution are removed from the substrate, the fluidity imparted to the reaction solution and the oxidizing solution due to the gravity. Also in the apparatus, similarly to FIG. 9, solutions reserved in tanks 33 and 35 are supplied through nozzles 29 and 31, respectively, to substrates 25 disposed on tilting table 39. At this time, a step in which after the solution is supplied through, for instance, the nozzle 29 to the substrate 25, the supplied solution is removed by the fluidity imparted to the solution due to the gravity, and after the solution is supplied through nozzle 29 to the substrate 25, the supplied solution is removed by the fluidity imparted to the solution due to the gravity is repeated.

Furthermore, in the invention, an example is shown in which a step in which after one solution is supplied, the supplied solution is removed, and after the other solution is supplied, the supplied solution is removed is repeated; however, two solutions may be simultaneously supplied.

In the following, a specific example of preparation of a ferrite thin film according to the third embodiment of the invention will be explained.

Example 5

On rotary table 9 such as shown in FIGS. 9 and 10, as substrates 25, glass plates rendered hydrophilic by plasma treatment are disposed and heated to 90 degree centigrade while rotating at 150 rpm under supply of deoxygenated ion exchange water. In the next place, in the apparatus, $N_2$ gas was introduced and a deoxygenated atmosphere was established. Two kinds of reaction solutions were prepared. Into deoxygenated ion exchange water, $FeCl_2.4H_2O$, $NiCl_2.6H_2O$, $ZnCl_2$, and $CoCl_2.6H_2O$, respectively, were dissolved by 3.3, 1.3, 0.03, and 0.1 g/L, and thereby a solution A was prepared. Into deoxygenated ion exchange water, $FeCl_2.4H_2O$, $NiCl_2.6H_2O$, and $ZnCl_2$, respectively, were dissolved by 3.3, 1.3, and 0.03 g/L, and thereby a solution B was prepared. Any one of the reaction solutions A and B and an oxidizing solution in which in deoxygenated ion exchange water, $NaNO_2$ and $CH_3COONH_4$, respectively, were dissolved by 0.3 and 5.0 g/L were respectively supplied from the nozzles at a flow rate of 30 ml/min for substantially 30 minutes. In the apparatus, since on a surface of the substrate, a magnetic field of substantially 50Oe was applied substantially in parallel with a film surface and the magnets are fixed independently from the rotary table, the substrate is considered to obtain the substantially the same effect as that in the case where the substrate is disposed in a rotating magnetic field. Thereafter, it was confirmed that on a taken out glass substrate, in all cases where the reaction solution A was used and the reaction solution B was used, a black mirror-like film was formed; in the case of the reaction solution A being used, it was ferrite made of Ni, Zn, Fe, Co and O; and in the case of the reaction solution B being used, it was ferrite made of Ni, Zn, Fe, and O. An amount of Co that was contained in the ferrite film when the reaction solution A was used was 0.0313 by a value of molar ratio of Co/(Fe+Ni+Zn+Co). When a magnetization curve of the prepared ferrite film was measured, in both cases of the reaction solution A being used and the reaction solution B being used, magnetization curves in any directions in a film plane had substantially the same shape, that is, a ferrite film magnetically isotropic in in-plane directions of the thin film was obtained. Each of obtained films was measured of a real part ($\mu'$) and an imaginary part ($\mu''$) of magnetic permeability and measurements shown in Table 8 were obtained.

TABLE 8

| | Frequency | | | | | |
|---|---|---|---|---|---|---|
| | 20 MHz | | 500 MHz | | 1500 MHz | |
| | $\mu'$ | $\mu''$ | $\mu'$ | $\mu''$ | $\mu'$ | $\mu''$ |
| Reaction solution A | 100 | 2 | 70 | 60 | 15 | 75 |
| Reaction solution B | 75 | 2 | 30 | 55 | 10 | 30 |

Both films exhibit excellent soft magnetic characteristics; however, one that was obtained by use of the reaction solution A, being high in $\mu'$ and maintaining high values in $\mu''$ over a very wide frequency range, exhibited excellent characteristics.

Example 6

With the magnets removed from the apparatus such as shown in FIGS. 9 and 10, under the conditions the same as that in the example 5 of the invention, films were prepared. According to measurement of the magnetization curve of the prepared ferrite film, in both cases of the reaction solutions A and B, in all directions in a film plane, the magnetization curves had substantially the same shapes; that is, a ferrite thin film magnetically isotropic in in-plane directions of the thin film was obtained. The real part ($\mu'$) and the imaginary part ($\mu''$) of the magnetic permeability of the obtained films are shown in the following Table 9.

TABLE 9

| | Frequency | | | | | |
|---|---|---|---|---|---|---|
| | 20 MHz | | 500 MHz | | 1500 MHz | |
| | $\mu'$ | $\mu''$ | $\mu'$ | $\mu''$ | $\mu'$ | $\mu''$ |
| Reaction solution A | 95 | 2 | 75 | 55 | 15 | 75 |
| Reaction solution B | 75 | 2 | 30 | 50 | 10 | 30 |

Both films exhibit excellent soft magnetic characteristics; however, one that was obtained by use of the reaction solution A, being high in $\mu'$ and maintaining high values of $\mu''$ over a very wide frequency range, exhibited excellent characteristics.

Example 7

On tilting table 39 of the apparatus such as shown in FIG. 11, as substrate 25, a glass plate rendered hydrophilic by the plasma treatment was disposed and heated to 90 degree centigrade under supply of deoxygenated ion exchange water. Subsequently, $N_2$ gas was introduced into the apparatus and thereby a deoxygenated atmosphere was established therein. Reaction solutions and an oxidizing solution were prepared similarly to that according to example 5 of the invention. The flow rates of the reaction solution and the oxidizing solution were adjusted to 30 ml/min. Thereafter, with a step in which one of the reaction solutions A and B was supplied from a nozzle for 0.5 seconds, thereafter the reaction solution was removed owing to the fluidity imparted to the reaction solution by the gravity, and after the oxidizing solution was supplied from a nozzle for 0.5 seconds, the oxidizing solution was removed owing to the fluidity imparted to the reaction solution by the gravity as one cycle, 2000 cycles were repeated. Thereafter, it was confirmed that on a taken out glass substrate, in all cases of the reaction solutions A being used and the reaction solution B being used, a black mirror-like film was formed; in the case of the reaction solution A being used, it was ferrite made of Ni, Zn, Fe, Co and O; and in the case of the reaction solution B being used, it was ferrite made of Ni, Zn, Fe, and O. An amount of Co that was contained in the ferrite film when the reaction solution A was used was 0.03/3 by a value of molar ratio of Co/(Fe+Ni+Zn+Co). When a magnetization curve of the prepared ferrite film was measured, in both cases of the reaction solution A and the reaction solution B, the magnetization curves in all directions in a film plane had substantially the same shape, that is, a ferrite film magnetically isotropic in in-plane directions of the thin film was obtained. Each of obtained films was measured of a real part ($\mu'$) and an imaginary part ($\mu''$) of the magnetic permeability and measurements shown in Table 10 were obtained.

TABLE 10

|  | Frequency | | | | | |
| --- | --- | --- | --- | --- | --- | --- |
|  | 20 MHz | | 500 MHz | | 1500 MHz | |
|  | $\mu'$ | $\mu''$ | $\mu'$ | $\mu''$ | $\mu'$ | $\mu''$ |
| Reaction solution A | 100 | 2 | 70 | 65 | 15 | 80 |
| Reaction solution B | 75 | 2 | 30 | 55 | 10 | 35 |

Both films exhibit excellent soft magnetic characteristics; however, one that was obtained by use of the reaction solution A, being high in $\mu'$ and maintaining high values in $\mu''$ over a very wide frequency range, exhibited excellent characteristics. In the embodiments according to the invention, the reaction solution and the oxidizing solution were removed owing to the centrifugal force or the tilting of the substrate; however, as far as the reaction solution and the oxidizing solution can be uniformly removed, the fluidity that can be imparted by supply of an inert gas or an inert gas containing oxygen may be used.

Furthermore, in example 5 of the invention, as means for randomizing a direction of the anisotropy of the constituents (grains) of the film, a rotating magnetic field was used; however, other means such as optimization of the crystal orientation and the surface roughness of a material that is used for the substrate may be used.

Example 8

The suppression effect of electromagnetic noise of the ferrite films obtained according to the invention, similarly to the first embodiment, was confirmed by use of an evaluation system shown in FIG. 6. With reference to FIG. 6, microstrip line (MSL) 43 is used as a substrate when a ferrite thin film is formed and a transmission line. The MSL 43 is provided with center conductor 63 having a width of substantially 3 mm in the center portion of a surface of 1.6 mm thick and 80 mm square glass epoxy substrate 61 over an entire width of 80 mm, a back surface thereof forms grounding conductor 65 and the characteristic impedance thereof is 50Ω. Furthermore, on a front surface of the MSL 43, over a substantially entire surface, ferrite thin film 45 obtained by use of the reaction solution B in example 5 of the invention is directly formed.

The transmission characteristics when a sample was disposed on the MSL 43 were measured with both ends of the MSL 43 connected through coaxial cables 47 to network analyzer 49 and with the transmission characteristics of the MSL 43 alone as a reference.

Figure 12A:
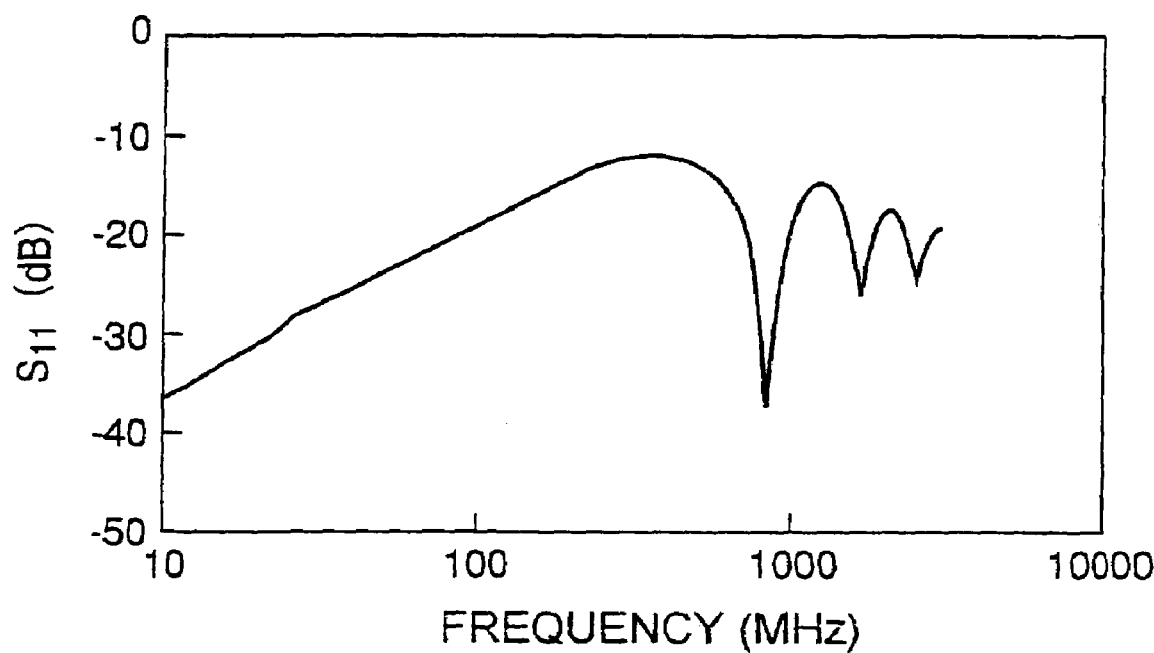
FIGS. 12A and 12B are diagrams showing an evaluation example of an electromagnetic noise suppression effect of a ferrite thin film according to the third embodiment of the invention.

With reference to FIG. 12A, the reflection characteristics (S11), in spite of the ferrite thin film sample being formed with a large area, is sufficiently low in its value. Accordingly, it is considered to be a level that, even when the ferrite thin film is applied in, for instance, an actual electronic circuit, does not adversely affect on transmission signals.

Figure 12B:
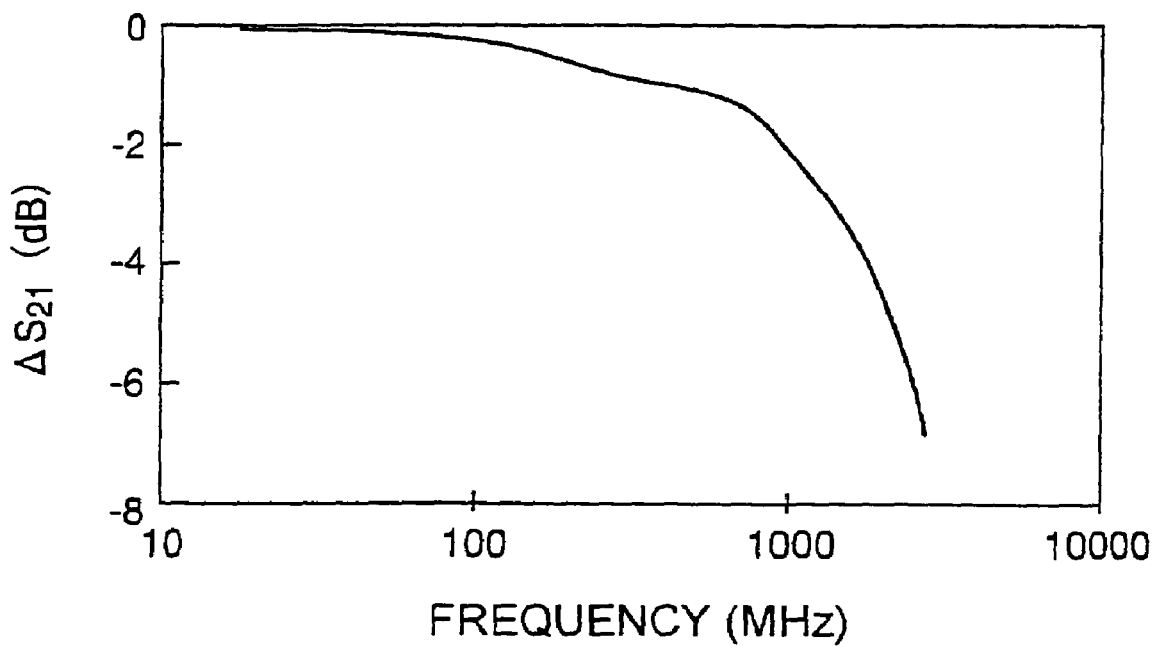

As shown in FIG. 12B, in the transmission characteristics ($\Delta S21$) that are obtained by subtracting the transmission loss of the MSL 43 itself, a large attenuation on a high frequency side can be confirmed. From these results, it can be found that the ferrite thin film according to the invention, when formed in a transmission line, is effective as an electromagnetic noise suppressor that can attenuate high frequency noise generated in an electronic device. Furthermore, the characteristics, by controlling an area, film thickness and composition of the thin film sample, can be controlled to desired characteristics.

As explained above, according to the third embodiment of the invention, a ferrite thin film in which constituents (grains or constituents analogous to that) constituting the ferrite film are regularly arranged can be obtained, and furthermore a very homogeneous ferrite thin film in which the constituents have the uniaxial anisotropy or multiaxial anisotropy and as a whole film in in-plane directions of the thin film the magnetic characteristics are isotropic can be obtained.

Furthermore, according to the third embodiment of the invention, when a step of bringing a reaction solution containing at least ferrous ion into contact with a substrate; a step of bringing an oxidizing solution containing at least an oxidant into contact with the substrate; and a step of removing a residue that does not contribute to the formation of the ferrite film of the reaction solution and the oxidizing solution from the substrate are provided, a manufacturing method of ferrite films that allows improving the formation rate and increasing the industrial productivity, regularly arranging the constituents that constitute the film and thereby obtaining very homogeneous ferrite film magnetically isotropic in a film plane can be obtained; accordingly, the industrial use value is very large.

Furthermore, when a ferrite plating film according to the third embodiment according to the invention is formed alone or formed on a support, alternatively when it is directly formed at least on one surface of an electronic wiring board or a semiconductor integrated wafer, an electromagnetic noise suppressor can be obtained.

What is claimed is:

1. An electromagnetic noise suppressor, comprising a ferrite film in which magnetized grains are regularly arranged, wherein the ferrite film has magnetic anisotropy or is magnetically isotropic; has a ratio of peak in intensities corresponding to a (222) crystal lattice plane and a (311) crystal lattice plane in an X-ray diffraction pattern of a surface of the film, $I_{222}/I_{311}$, said ratio being larger than 0.05; is composed of at least one of Ni, Zn, Fe, and O and contains Co in a molar ratio of Co/(Fe+Ni+Zn+Co) of 0.01/3 to 0.3/3.

2. An electromagnetic noise suppressor as set forth in claim 1, wherein the ferrite film is directly or indirectly formed on any one substrate of a support, an electronic wiring board and a semiconductor integrated wafer.

3. An electromagnetic noise suppressor as set forth in claim 1, said ferrite film having the magnetic anisotropy.

4. An electromagnetic noise suppressor as set forth in claim 3, wherein the constituents have the uniaxial anisotropy.

5. An electromagnetic noise suppressor as set forth in claim 4, wherein said ferrite film having an axis of easy magnetization due to the uniaxial anisotropy of the constituents, said axis being either in substantially parallel with a thickness direction of the ferrite film or in substantially parallel with an in-plane direction of the ferrite film.

6. An electromagnetic noise suppressor as set forth in claim 1, the ferrite film having the magnetic isotropy.

7. An electromagnetic noise suppressor as set forth in claim 6, wherein the magnetized grains have the entirely multiaxial anisotropy, or a portion of the magnetized grains have multiaxial anisotropy, and another portion of the magnetized grains have multiaxial anisotropy, each anisotropy of the magnetized grain being totally brought into isotropic state.

8. An electromagnetic noise suppressor as set forth in claim 7, one portion of the magnetized grain having uniaxial anisotropy, another having multiaxial an isotropy, the ferrite film having an axis of easy magnetization due to the uniaxial anisotropy of the portion of the magnetized grain, wherein said axis is either substantially parallel with a thickness direction of the ferrite film or substantially parallel with an in-plane direction of the ferrite film.

9. An electromagnetic noise suppressor as set forth in claim 1, the ferrite film includes Ni, Zn, Fe and O.

10. An electromagnetic noise suppressor as set forth in claim 9, further including Co; wherein a content of Co, by a value of Co/(Fe Ni+Zn+Co) by molar ratio, is 0.01/3 to 0.1/3.

11. An electromagnetic noise suppressor as set forth in claim 10, wherein owing to the induced magnetic anisotropy resulting from a peculiar distribution of Co ions, an axis of easy magnetization of the ferrite film is in substantially parallel with a thickness direction thereof or with an in-plane direction.

12. An electromagnetic noise suppressor as set forth in claim 1, wherein the constituent having uniaxial anisotropy.

13. An electromagnetic noise suppressor as set forth in claim 1, wherein the magnetized grains having multiaxial anisotropy include Ni, Zn, Fe and O.

14. An electromagnetic noise suppressor as set forth in claim 1, the ferrite film including at least one kind of Ni, Zn, Fe and O and wherein Co is not present.

15. An electromagnetic noise suppressor, comprising a ferrite film consisting essentially of magnetized grains that are regularly arranged and wherein the ferrite film has magnetic anisotropy or is magnetically isotropic; has a ratio of peak in intensities corresponding to a (222) crystal lattice plane and a (311) crystal lattice plane in an X-ray diffraction pattern of a surface of the film, $I_{222}/I_{311}$, said ratio being larger than 0.05; and is composed of at least one of Ni, Zn, Fe and O.

16. An electromagnetic noise suppressor as set forth in claim 15, wherein the ferrite film has magnetic anisotropy.

17. An electromagnetic noise suppressor as set forth in claim 16, wherein the magnetized grains have uniaxial anisotropy.

18. An electromagnetic noise suppressor as set forth in claim 17, wherein said ferrite film having an axis of easy magnetization due to the uniaxial anisotropy of the magnetized grains, wherein the axis is either substantially parallel with a thickness direction of the ferrite film or substantially parallel with an in-plane direction of the ferrite film.

19. An electromagnetic noise suppressor as set forth in claim 15, wherein the ferrite film is magnetically isotropic.

20. An electromagnetic noise suppressor as set forth in claim 19, wherein the magnetized grains have entirely multiaxial anisotropy or a portion of the magnetized grains have uniaxial anisotropy, each anisotropy of the magnetized grains being totally brought into isotropic state.

21. An electromagnetic noise suppressor as set forth in claim 20, one portion of the magnetized grains having uniaxial anisotropy, another having multiaxial anisotropy, the ferrite film having an axis of easy magnetization due to the uniaxial anisotropy of the portion of the magnetized grains, wherein the axis is either substantially parallel with a thickness direction of the ferrite film or substantially parallel with an in-plane direction of the ferrite thin film.

22. An electromagnetic noise suppressor as set forth in claim 15, wherein the ferrite film includes Ni, Zn, Fe and O.

23. An electromagnetic noise suppressor as set forth in claim 15, wherein the magnetized grains have uniaxial anisotropy.

24. An electromagnetic noise suppressor as set forth in claim 15, wherein the magnetized grains have multiaxial anisotropy and include Ni, Zn, Fe and O.

* * * * *